(12) United States Patent
Kitahira et al.

(10) Patent No.: US 7,532,141 B2
(45) Date of Patent: May 12, 2009

(54) PULSE WIDTH MODULATION METHOD AND DIGITAL ANALOGUE CONVERTER USING THE SAME

(75) Inventors: Naotake Kitahira, Osaka (JP); Tsuyoshi Takayama, Shiga (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 12/016,618

(22) Filed: Jan. 18, 2008

(65) Prior Publication Data

US 2008/0180293 A1 Jul. 31, 2008

(30) Foreign Application Priority Data

Jan. 22, 2007 (JP) ............................. 2007-011447

(51) Int. Cl.
*H03M 1/82* (2006.01)

(52) U.S. Cl. ........................ 341/152; 341/76; 341/77; 341/143; 341/144; 332/109

(58) Field of Classification Search ............... 341/76, 341/77, 152
See application file for complete search history.

(56) References Cited

U.S. PATENT DOCUMENTS

| | | | |
|---|---|---|---|
| 5,008,675 A | | 4/1991 | Toyomaki |
| 5,124,703 A | * | 6/1992 | Kaneaki et al. ............... 341/77 |
| 6,373,334 B1 | * | 4/2002 | Melanson .................... 330/10 |
| 7,209,067 B1 | * | 4/2007 | Melanson .................... 341/155 |

FOREIGN PATENT DOCUMENTS

| | | |
|---|---|---|
| JP | 1-91515 | 4/1989 |
| JP | 2-65412 | 3/1990 |
| JP | 7-87375 | 9/1995 |

OTHER PUBLICATIONS

Jun Honda, "Designing and Manufacturing of Class D/Digital Amplifier", CQ Publishing, Nov. 1, 2004, pp. 212-219 (along with English translation).

* cited by examiner

*Primary Examiner*—Khai M Nguyen
(74) *Attorney, Agent, or Firm*—Wenderoth, Lind & Ponack, L.L.P.

(57) ABSTRACT

In a pulse width modulation method of the present invention, a digital signal is modulated and a pulse width modulation signal is generated in a pulse width modulator by using a digital signal output unit and the pulse width modulator The pulse width modulation method includes: outputting to the pulse width modulator a first value corresponding to the input signal as a first digital signal at a first timing by the digital signal output unit; determining a limited value range based on the first value by the digital signal output unit; determining a second value corresponding to a new input signal by the digital signal output unit; judging whether or not the second value is included in the limited value range, and when the second value being judged to be included, outputting the second value to the pulse width modulator as a second digital signal, and when the second value being judged not to be included, outputting a value included in the limited value range to the pulse width modulator as the second digital signal at the second timing at which at least one cycle has elapsed from the first timing by the digital signal output unit; and modulating the pulse width of the second digital signal and generating the pulse width modulation signal, by the pulse width modulator.

17 Claims, 11 Drawing Sheets

US 7,532,141 B2

PULSE WIDTH MODULATION METHOD AND DIGITAL ANALOGUE CONVERTER USING THE SAME

BACKGROUND OF THE INVENTION

1. Field of the Invention

The present invention relates to a pulse width modulation method, and particularly relates to a method for pulse-width modulating (PWM) a digital signal input from a digital signal output unit in a digital-analogue (D/A) converter. Also, the present invention relates to a D/A converter using this pulse width modulation method.

2. Description of the Related Art

In a process of converting a digital signal to an analogue signal (digital-analogue (D/A) conversion)), a pulse width modulation (PWM) is widely used.

In a well-known PWM method, based on the digital signal inputted to a PWM modulator in each PWM cycle, a time width of a section of a high level (H level) of a pulse (PWM signal) and a time width of a section of a low level (L level) of the pulse (PWM signal) are determined, and a profile of an output pulse is determined.

FIG. 1 is a diagram exemplifying the PWM signal formed in one system of a well-known PWM system. In this example, a point where the pulse changes from the section of the L level to the section of the H level (Hereinafter, this point is referred to as a "rising" of a PWM signal.) is fixed with respect to a PWM timing signal, and the point where the PWM signal changes from the section of the H level to the section of the L level (Hereinafter, this point is referred to as the "falling" of the PWM signal.) is determined so as to correspond to the time width of sections of the H level and the L level determined based on the inputted digital signal, thereby determining the profile of the pulse (PWM signal).

PWM cycles P1 and P2 shown in FIG. 1 are defined by the PWM timing signal, and a PWM clock shown in FIG. 1 is a clock signal for dividing a PWM cycle T into 16. In this figure, a cycle of this PWM clock is shown by t. Rising and falling of an output pulse (PWM signal) are realized based on the PWM clock. Therefore, if the use of the PWM signal with the entire section within 1 PWM cycle being set at H level or L level is allowed, profiles of the PWM signal which can be realized within one cycle of the PWM cycles are as much as 17 kinds. This means that the digital signal having the gradation number of 17 steps is PWM modulatable. When the digital signal inputted in the PWM modulator is correlated to an integer value of equal numbers of plus or minus centering around zero, 17 kinds such as −8, −7, −6, −5, −4, −3, −2, −1, 0, +1, +2, +3, +4, +5, +6, +7, and +8 are possible as values shown by the inputted digital signal. That is, the integers of not less than −8 and not more than +8 can be set as the values in a value range shown by the inputted digital signal.

However, when there is a limit in a response speed of a device using the PWM signal (pulse) outputted from the PWM modulator, a minimum width of each section width of the H level and the L level of the PWM signal is limited to an extent allowing this device to respond (for example, limited to 2t or more), and a stable operation of this device is secured. In addition, in some cases, the PWM signal is formed so as to include rising and falling, so that an area formed by the pulse included in the profile is linearly increased or decreased corresponding to a change of the profile of the PWM signal.

As described above, when the minimum widths of the section widths of the H level and the L level are limited to 2PWM clock (2t) or more so as to secure the stable operation of the device positioned on a lower stream side or when the rising and falling is surely provided within one cycle of the PWM cycles by limiting the minimum width of the section width of the H level and the L level to 2PWM clock (2t) or more, the gradation number of the PWM modulatable digital signal is decreased.

In an example of FIG. 1, the minimum value of the section width of the H level and the L level is set at 4PWM clock (4t), respectively. A PWM signal S101 is a pulse having a maximum H level section width (minimum L level section width) under the aforementioned limit. A PWM signal S103 shows an example of the PWM signal realized by advancing the timing of falling than that of the PWM signal S101. A PWM signal S105 is an outputted PWM signal when the timing of falling is maximally advanced under the aforementioned limit. The PWM signal S105 has an H level section width (maximum L level section width) under the aforementioned limit. Thus, under the aforementioned limit, the PWM signal having 9 kinds of profiles can be outputted, and the digital signal having the gradation number of 9 steps at maximum is PWM modulatable. That is, the integers of not less than −4 and not more than +4 can be set as the values in the value range shown by the digital signal input.

Japanese Examined Patent Application Publication No. 07-087375 (JP 07-087375 B) discloses pulse width modulation (PWM) in a delta-sigma (ΔΣ) type digital-analogue (D/A) converter. Also, "Designing and manufacturing of Class D/digital amplifier", written by Jun Honda, CQ Publishing, discloses PWM to a digital signal, in FIG. 9 or FIG. 30 of section 9-7 (page 214) of chapter 9. In JP 07-087375 B and "Designing and manufacturing of Class D/digital amplifier", as shown in FIG. 2, the PWM signal is outputted so that a center of the pulse of the PWM signal is coincident to a center point on the time axis of each PWM cycle.

In the example of FIG. 2 also, like the example of FIG. 1, each section width of the H level and the L level has at least a section width of 4t or more, and a continuance of sections of the H level or the sections of the L level is prohibited. In this case, both ends of one PWM cycle form an L level section having at least a section width of 2t or more, as shown in a PWM signal S107. Accordingly, in each PWM cycle P1 and P2, the PWM signal with the section width of the H level having a section width of not less than 4t and not more than 12t can be outputted as shown in a PWM signal S109 or S111. This means that the digital signal having the gradation number of 5 steps at maximum is PWM modulatable.

In the example of FIG. 2, a boundary part of the PWM cycle is always the section of the L level. However, of course, if it is designed so that the H level and the L level are replaced and used, the PWM signal can be outputted, with the boundary part of the PWM cycle set to be always H level.

Thus, in the present PWM method, in order to overcome the problem regarding the response speed of the device using the PWM signal and the problem such as a linearity deterioration caused by increase/decrease of the area of the pulse, the gradation number of the digital signal that can be inputted is significantly reduced.

SUMMARY OF THE INVENTION

In a conventional pulse width modulation (PWM), the limitation on the minimum value of the pulse width (the section width of the H level) and a pulse interval (the section width of the L level) is set in consideration of the response speed of a circuit, and the like, such as an MOS driver using the outputted PWM signal, or in order to prevent a deterioration in linearity regarding the area of the pulse due to the number of the rising of the pulse and/or the number of falling of the pulse being included in a PWM signal within each PWM cycle, namely, different number of edges, the rising and falling are surely provided within the 1PWM cycle. That is, an output of the PWM signal having the profile forming the section of the H level or the section of the L level entirely within one cycle of the PWM cycles is prohibited. By setting such limitation or prohibiting matter, the gradation number of the PWM modulatable digital signal is decreased. In view of the fact, it is an object of the present invention to provide PWM method being capable of suppressing a decrease of the gradation number of the PWM modulatable digital signal and a PWM modulator using the same.

The present invention provides a pulse width modulation method, having several aspects as follows.

In one aspect of the present invention, the present invention is a pulse width modulation method. In the pulse width modulation method, a digital signal is modulated and a pulse width modulation signal is generated in a pulse width modulator, by using a digital signal output unit which receives an input signal on a cycle basis and outputs the digital signal corresponding to the input signal and the pulse width modulator which is capable of modulating the digital signal, the value of which is included in a prescribed value range in synchronization with the cycle. The pulse width modulation method includes: outputting to the pulse width modulator a first value corresponding to the input signal as a first digital signal at a first timing by the digital signal output unit; determining a limited value range based on the first value by the digital signal output unit; determining a second value corresponding to a new input signal by the digital signal output unit; judging whether or not the second value is included in the limited value range, and when the second value being judged to be included, outputting the second value to the pulse width modulator as a second digital signal, and when the second value being judged not to be included, outputting a value included in the limited value range to the pulse width modulator as the second digital signal at the second timing at which at least one cycle has elapsed from the first timing by the digital signal output unit; and modulating the pulse width of the second digital signal and generating the pulse width modulation signal, by the pulse width modulator.

According to the one aspect of the present invention, it is preferable that the limited value range is included in the prescribed value range.

According to the one aspect of the present invention, it is preferable that the pulse width modulation signal includes at least one of a section of a first signal and a section of a second signal having an output level different from the first signal, each having a time width based on a value of the digital signal being input; and the limited value is determined so that a signal which is constituted by connecting a pulse width modulation signal being generated based on the second digital signal after a pulse width modulation signal being generated based on the first digital signal includes two sections of two first signals and the section of the second signal which is sandwiched between the two first signals, and the section of the second signal has a time width being greater than or equal to a prescribed time width.

According to the one aspect of the present invention, it is preferable that in the determining the limited value range, the limited value range is determined based on the first value and an output level of the pulse width modulation signal at a prescribed timing within a cycle including the first timing; and in the generating the pulse width modulation signal, based on the output level of the pulse width modulation signal at the prescribed timing, the pulse width modulation signal corresponding to the second digital signal is generated.

According to the one aspect of the present invention, it is preferable that the section of the first signal in each cycle is longitudinally symmetric about a time center of the cycle, and the pulse width modulation signal has the second signal at a boundary between a cycle starting from the first timing and a cycle starting from the second timing.

According to the one aspect of the present invention, it is preferable that the section of the first signal in each cycle is longitudinally symmetric about a time point shifted from a time center of the cycle by a given time.

According to the one aspect of the present invention, it is preferable that in the generating the pulse width modulation signal, the pulse width modulation signal is generated so that the pulse width modulation signal has the first signal at a boundary between a cycle starting from the first timing and a cycle starting from the second timing.

According to the one aspect of the present invention, it is preferable that the prescribed value range and the limited value range are set so that a difference in widths of these both value ranges is less than or equal to a prescribed value.

In another aspect of the present invention, the present invention is a digital-analogue converter.

In another aspect of the present invention, the digital-analogue converter includes: a digital signal output unit which receives an input signal on a cycle basis and outputs a digital signal corresponding to the input signal; and a pulse width modulator which is capable of modulating the digital signal, the value of which is included in a prescribed value range in synchronization with the cycle. In the digital-analogue converter, the pulse width modulator modulates the digital signal and generates a pulse width modulation signal; the digital signal output unit includes a digital signal generator which generates the digital signal corresponding to the input signal and a digital signal limiter which limits and outputs the generated digital signal; the digital signal limiter limits the digital signal generated by said digital signal generator to a value range which is limited based on a first digital signal outputted to the pulse width modulator by the digital signal output unit at a first timing, outputs the limited digital signal to the pulse width modulator as a second digital signal at a second timing at which at least one cycle has elapsed from the first timing, and sends an error occurred in the limitation as a limit error to the digital signal generator; and the pulse width modulator modulates the inputted second digital signal and generates the pulse width modulation signal.

According to another aspect of the present invention, it is preferable that the pulse generator performs pulse width modulation so as to output the pulse width modulation signal including at least one of a section of a first signal and a section of a second signal having an output level different from the first signal, based on a value of the digital signal being input; the pulse generator generates and outputs a pulse width modulation signal based on the first digital signal and thereafter continuously generates and outputs a pulse width modulation signal based on the second digital signal; the pulse width modulation signals being continuously outputted include at least two sections of two first signals and the section of the second signal which is sandwiched between the two sections of the two first signals; and the digital signal limiter outputs the second digital signal so that the sandwiched section of the second signal has a time width being greater than or equal to a prescribed time width.

According to another aspect of the present invention, it is preferable that the pulse generator performs pulse width modulation so as to output the pulse width modulation signal including at least one of a section of a first signal and a section of a second signal having an output level different from the first signal, based on a value of the digital signal being inputted; the pulse generator generates and outputs a pulse width modulation signal based on the first digital signal and thereafter continuously generates and outputs a pulse width modulation signal based on the second digital signal; the pulse width modulation signals being continuously outputted include at least two sections of two first signals and the section of the second signal which is sandwiched between the two sections of the two first signals; and the digital signal limiter outputs the second digital signal so that the sandwiched section of the second signal has a time width being greater than or equal to a prescribed time width.

According to another aspect of the present invention, it is preferable that the pulse generator generates the pulse width modulation signal so that the section of the first signal in each cycle is longitudinally symmetric about a time center of the cycle, and the pulse width modulation signal has the second signal at a boundary between a cycle starting from the first timing and a cycle starting from the second timing.

According to another aspect of the present invention, it is preferable that the pulse generator generates the pulse width modulation signal so that the section of the first signal is longitudinally symmetric about a time point shifted from a time center of the cycle by a given time.

According to another aspect of the present invention, it is preferable that the pulse generator is capable of generating the pulse width modulation signal so that the pulse width modulation signal has the first signal at a boundary between a cycle starting from the first timing and a cycle starting from the second timing.

According to another aspect of the present invention, it is preferable that when the pulse width modulation signal being generated and outputted based on the first digital signal includes only the section of the first signal in a cycle starting from the first timing, the digital signal limiter limits the digital signal generated by the digital signal generator to the limited value range so that the pulse width modulation signal generated and outputted based on the second digital signal has the section of the second signal in a cycle starting from the second timing, and outputs the digital signal as the second digital signal; the pulse generator generates the pulse width modulation signal corresponding to the second digital signal so that the pulse width modulation signal has the section of the second signal at a start of the cycle starting from the second timing; and the pulse width modulation signal being generated and outputted based on the first digital signal and the pulse width modulation signal corresponding to the second digital signal have one or more edges of prescribed number, respectively.

According to another aspect of the present invention, it is preferable that the prescribed value range and the limited value range are set so that a difference in widths of these both value ranges is less than or equal to a prescribed value.

According to another aspect of the present invention, it is preferable that the digital signal generator is a noise shaping type delta-sigma quantizer.

In the PWM modulation method according to the present invention, the gradation number of the PWM modulatable digital signal can be increased than ever before, while limiting the minimum value of the pulse width and the pulse interval in consideration of the response speed of the circuit etc. which uses the output of the PWM modulation and while taking a measure for preventing the deterioration in linearity regarding the output pulse of the PWM modulation in the same way as a conventional method. Consequently, the present invention succeeds in expanding a dynamic range of the PWM modulation than that of a conventional one, while securing the operation stability of the same extent as that of the conventional method. Other objects and further features of the present invention will be apparent from the following detailed description when read in conjunctions with the accompanying drawings.

DETAILED DESCRIPTION OF THE PREFERRED EMBODIMENTS

With reference to the drawings, preferred embodiments of the present invention will be explained hereunder.

In a PWM modulation method according to the present invention, based on a digital signal being outputted from a digital signal output unit to a pulse width modulator in a certain PWM cycle, the digital signal output unit limits a value range of a digital signal being outputted to the pulse width modulator in the next PWM cycle. The digital signal output unit refers to the limited value range to determine a second digital signal corresponding to a new input signal. When it is judged that a value corresponding to the new input signal is included in the limited value range, the value is outputted to the pulse width modulator as the second digital signal. When it is judged that the value is not included in the limited value range, a value which is included in the limited value range is outputted to the pulse width modulator as the second digital signal. Thus, in the PWM method according to the present invention, based on the digital signal being inputted to the pulse width modulator in a certain PWM cycle, the value range (gradation number of steps) of the digital signal being inputted to the PWM modulator in the next PWM cycle is changed. By changing the value range as needed, it is possible to expand the gradation number of steps (dynamic range) of a PWM modulatable digital signal.

First Embodiment

Figure 1:
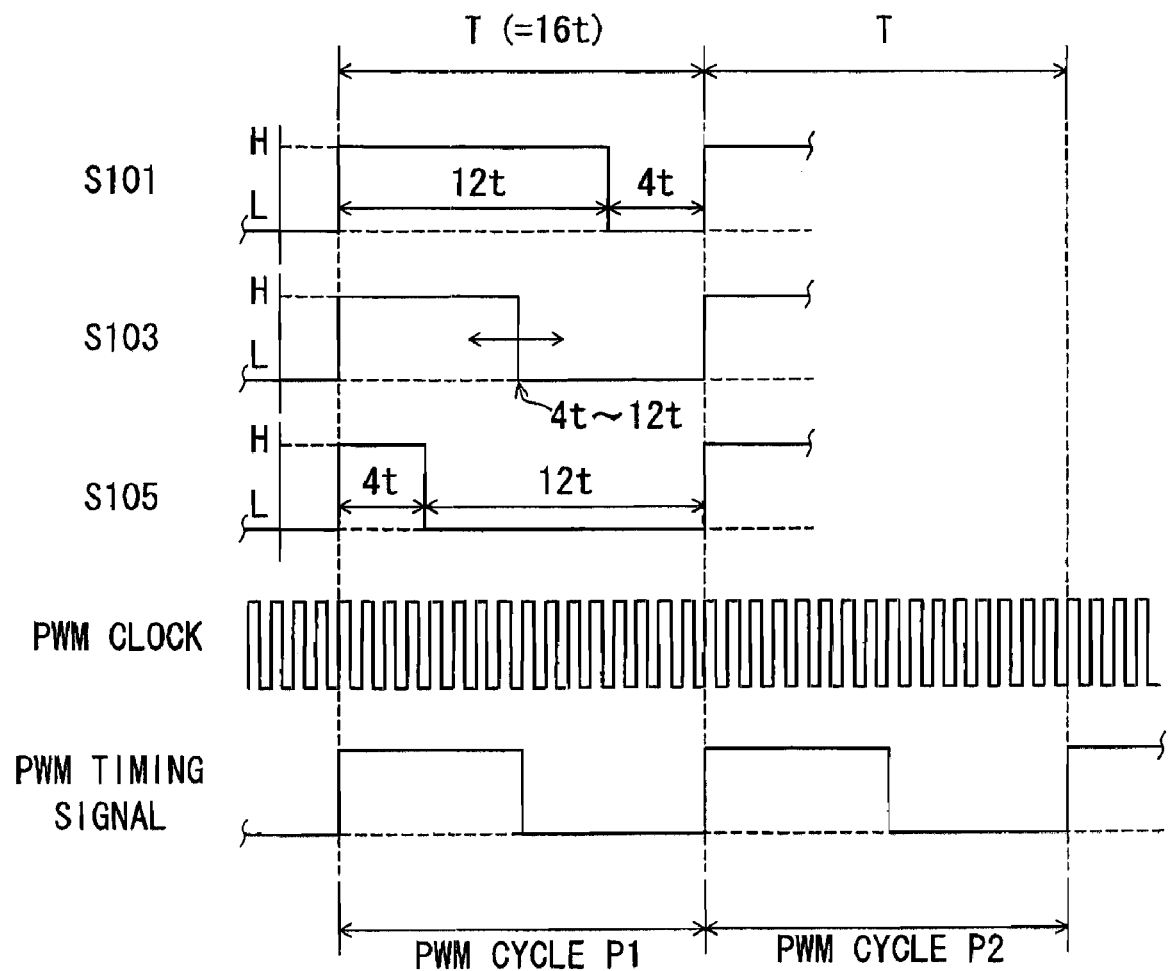
FIG. 1 is a diagram of an output example of PWM signals by a conventional PWM modulation method.
Figure 2:
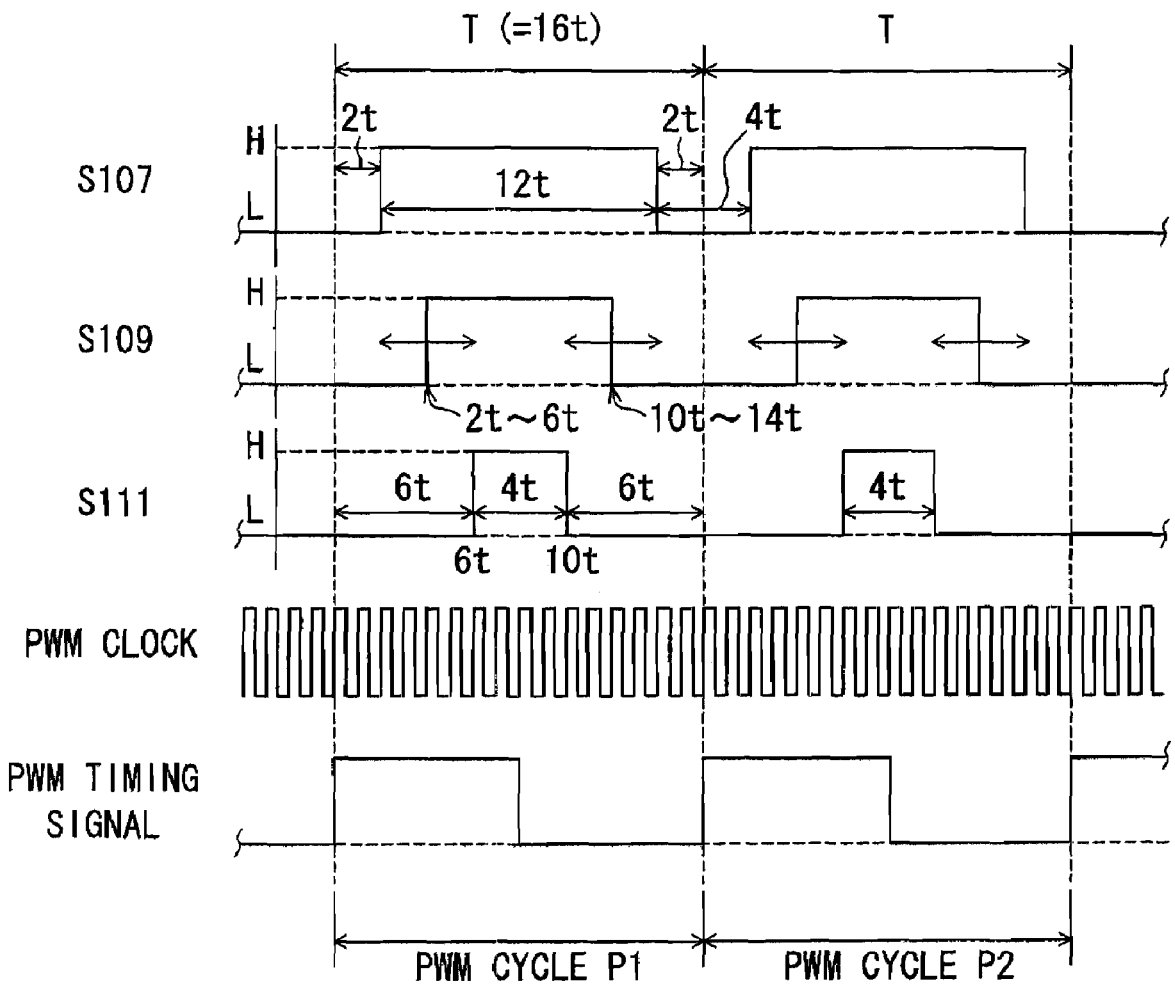
FIG. 2 is a diagram of another output example of PWM signals according to Ei conventional PWM modulation method.
Figure 3:
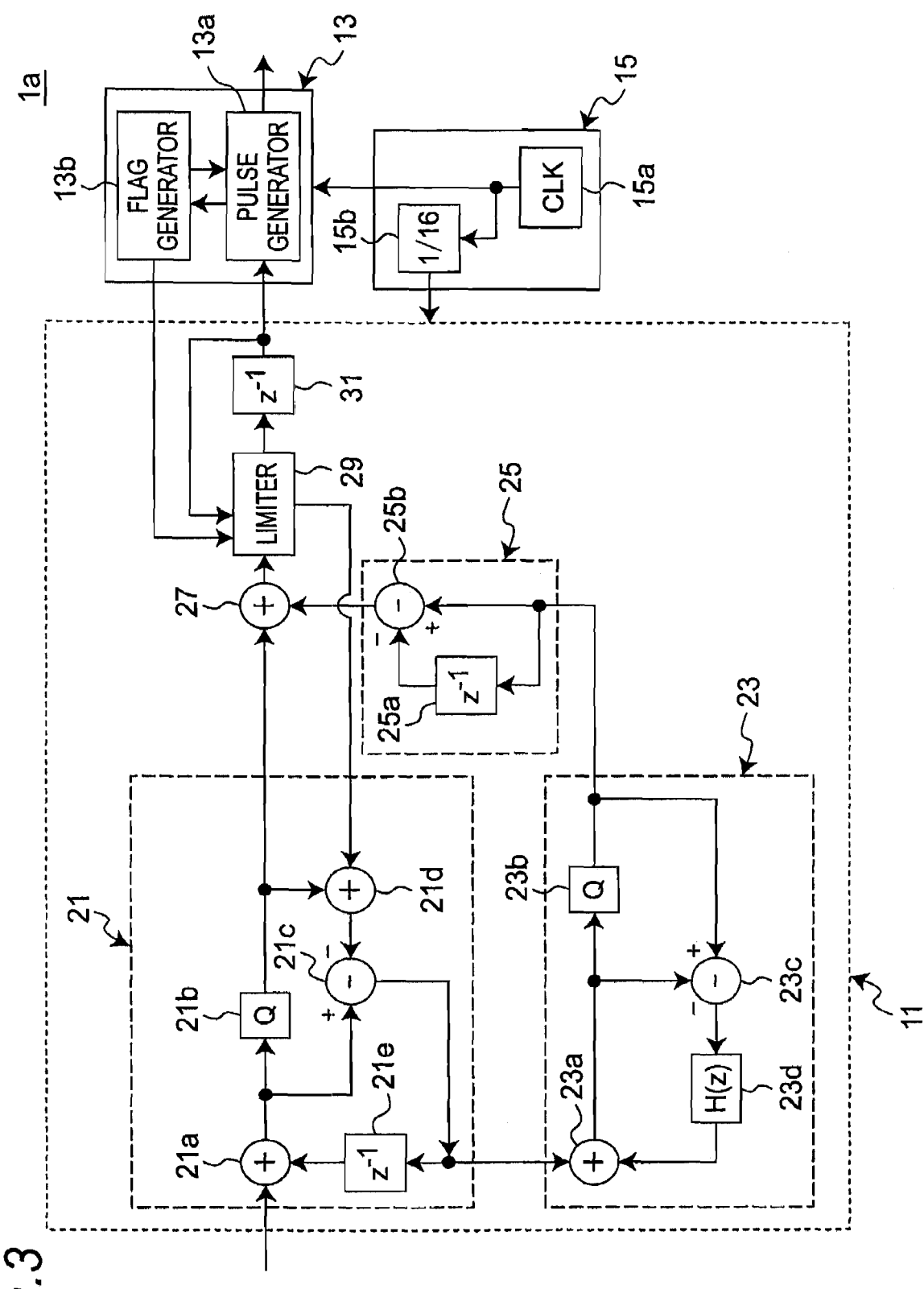
FIG. 3 is a diagram of a D/A converter according to first embodiment.

FIG. 3 is a block diagram of a digital-analogue converter (D/A converter) according to a first embodiment of the present invention. The D/A converter $1a$ is a so-called delta-sigma ($\Delta\Sigma$) type D/A converter. The D/A converter $1a$ has a multi-stage noise shaping (MASH) type $\Delta\Sigma$ modulator 11, a pulse width modulator (PWM modulator) 13 which inputs the digital signal outputted from the MASH type $\Delta\Sigma$ modulator 11 and performs PWM modulation to the digital signal, and a clock signal generator 15 which provides a timing to the MASH type $\Delta\Sigma$ modulator 11 and the PWM modulator 13.

The MASH type $\Delta\Sigma$ modulator 11 constitutes a digital signal generator.

The MASH type $\Delta\Sigma$ modulator 11 has: a main loop 21 which constitutes a single integration type noise shaping quantizer having a noise shaping order of a first order; a sub-loop 23 which constitutes a multiple integration type noise shaping quantizer having a noise shaping order of a first or higher order; a differentiator 25 which differentiates and outputs an output from the sub-loop 23 according to the noise shaping order of the main loop 21; an adder 27 which adds the output of the main loop 21 and the output of the differentiator 25; a limiter 29 which inputs the output of the adder 27 and outputs a digital signal being inputted to the pulse width modulator 13; and a delay unit 31 which delays the output of the limiter 29 by one cycle of the PWM cycle.

The limiter 29 and the delay unit 31 constitutes a digital signal limiter which determines a value range of the digital signal being outputted to the pulse width modulator 13 and limits a value of the digital signal within the value range.

The digital signal limiter and the digital signal generator constitute a digital signal output unit.

The main loop 21 includes: an adder $21a$ which adds a signal being inputted to the MASH type $\Delta\Sigma$ modulator 11 in a certain PWM cycle and a quantization error etc. being generated in the one preceding cycle of the PWM cycle; a first local quantizer $21b$; a subtractor $21c$ which generates the quantization error etc.; an adder $21d$ which adds a quantization error occurred in the first local quantizer $21b$ and a limit error occurred in the limiter 29 and sends the result to the subtractor $21c$; and a delay unit $21e$.

The sub-loop 23 includes: an adder $23a$ which adds the quantization error etc. occurred in the main loop 21 and an output of a feedback circuit $23d$; a second local quantizer $23b$; a subtractor $23c$; and the feedback circuit $23d$ which has a transfer function H(z) being set so that the sub-loop 23 has the noise shaping characteristic of second or higher order.

The differentiator 25 includes a delay unit $25a$ and a subtractor $25b$.

The adder 27 adds the output of the main loop 21 and the output of the differentiator 25 and outputs the result to a limiter 29.

The main loop 21, the sub-loop 23, the differentiator 25, and the adder 27 constitute a (the noise shaping order of the sub-loop +1)-th order MASH type quantizer.

The MASH type quantizer generates a digital signal corresponding to a signal being inputted to the MASH type $\Delta\Sigma$ modulator 11.

The limiter 29 inputs the output of the adder 27 and the output of itself at the one preceding cycle of the PWM cycle being fed back through the delay unit 31, namely, the immediately preceding output from the limiter 29, and a flag being outputted from a flag generator $13b$ of a PWM modulator 13 as will be described later, and, based on these three inputs, determines the output to the delay unit 31 and outputs it. When there is a difference between the output of the adder 27 and the output from the limiter 29 to the delay unit 31, the limiter 29 may output to the adder $21d$ the difference between the output of the adder 27 and the output from the limiter 29 to the delay unit 31 as a limit error.

The delay unit 31 delays the output from the limiter 29 to the delay unit 31 by one cycle of the PWM cycle, and inputs the output to the pulse generator $13a$ of the PWM modulator 13.

The PWM modulator 13 includes the pulse generator $13a$ and the flag generator $13b$. The pulse generator $13a$ converts the input from the delay unit 31 into a pulse (PWM signal) with reference to the flag being generated by the flag generator $13b$ and outputs the PWM signal. Here, the flag generator $13b$ generates the flag which is binarized and changed according to two levels (high level (H level) and low level (L level)) of the pulse generated by the pulse generator $13a$. The flag generated by the flag generator $13b$ is sent to the limiter 29 as well as to the pulse generator $13a$. The flag generator $13b$ may also be configured so that the pulse generator $13a$ may refer to a flag being delayed by one PWM cycle.

The clock signal generator 15 includes a clock signal generator $15a$ and a frequency divider $15b$. The clock signal generator $15a$ generates a PWM clock, being a basis of the timing of generation of the pulse in the pulse generator $13a$, and sends the PWM clock to the PWM modulator 13. In addition, the generated PWM clock is also sent to the frequency divider $15b$. The frequency divider $15b$ outputs the signal, being a basis of the timing of the PWM cycle and having a cycle of 16 times of the PWM clock cycle, to the MASH type $\Delta\Sigma$ modulator 11 as a PWM timing signal.

Figure 4:
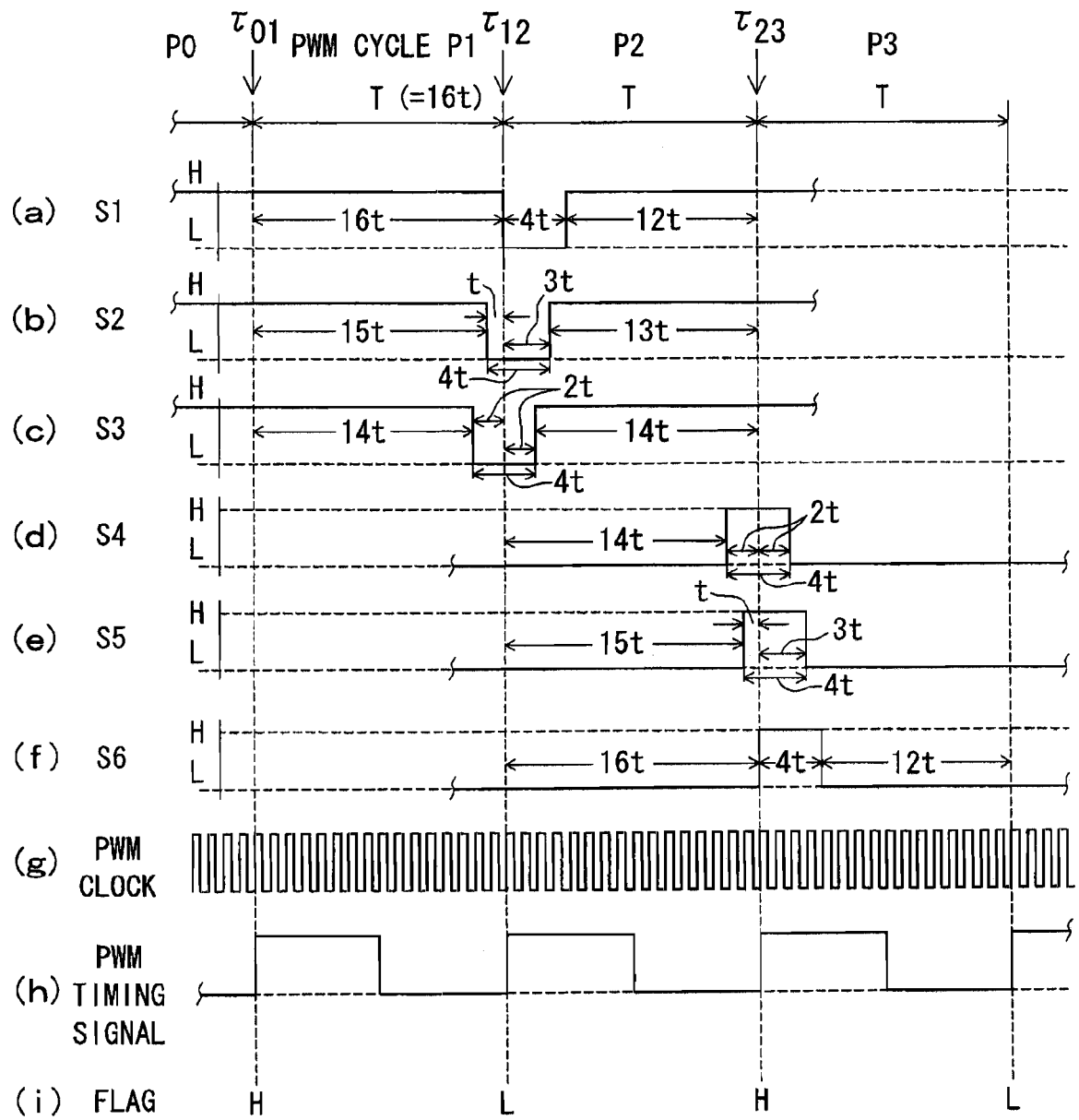
FIG. 4 is a diagram of an output example of PWM signals by the PWM modulation method according to the first embodiment.

FIG. 4($a$) to ($f$) is a diagram of several examples of the PWM signal (pulse) being outputted by the pulse generator $13a$ of the PWM modulator 13. FIG. 4($g$) to ($i$) is a diagram of the PWM clock and the PWM timing signal outputted from the clock signal generator 15, and the value of the flag at a boundary of the PWM cycle (P1, P2, and P3). With reference to the figure, the PWM modulation according to this embodiment will be explained. The interval of the PWM clocks is represented by t, and the interval of the PWM timing signals is represented by 16t (16t=T, T represents the PWM cycle).

In the PWM modulation method according to this embodiment, a section where the H level is outputted (the section of a first signal) and a section where the L level is outputted (the section of a second signal) are limited so as to have at least a section width of 4 clocks (4t) or more of the PWM clock. In this embodiment, a value of an output of the PWM modulation is determined based on a size of the section of the first signal (such as an area of the pulse) being included within each PWM cycle. Thus, as described above, it is possible to prevent a change of level of the PWM signal at a speed which exceeds a response speed of a circuit etc., such as an MOS driver which utilizes the output of the PWM modulator 13, and a stable operation of such device is secured. Further, in the PWM modulation method according to this embodiment, when the pulse is entirely set in a state representing a first signal (either one of the H level and the L level) across successive two cycles, the value of the digital signal being inputted to the pulse generator $13a$ may be limited so that the pulse should be set in a state representing a second signal from or immediately after the start timing of the next cycle, and the PWM signal may be generated based on the value of the limited digital signal. For example, a PWM signal S1 of FIG. 4($a$) may take the H level from the start timing of the cycle P0, which is partially not shown, and take the H level all over the cycle of cycle P0. Further, as shown in the figure, the H level may be taken also all over the cycle of cycle P1, but in such case, in cycle P2, the PWM signal should be generated so that the PWM signal S1 is set in the L level from the start timing of the cycle of the cycle P2, immediately. Thus, in each PWM cycle (a boundary of a cycle may be included in the PWM cycle of interest.), one or two constant number of edges (rising or falling) surely exist, thus preventing the deterioration in linearity regarding the area of the pulse of the PWM signal.

In this example, the PWM cycle T is expressed as T=16t (the PWM cycle is 16 times of the cycle of the PWM clock). Therefore, the PWM signal can constitute 17 kinds of profiles within one cycle of the PWM cycle. That is, 17 kinds of section widths, from 0t to 16t, of the H level in one cycle of the PWM cycle are possible. Here, when the digital signal correlated to the value zero is inputted in the PWM modulator 13, the pulse in which the section width of the H level in one cycle of the PWM cycle and the section width of the L level in the one cycle of the PWM cycle are equal to each other is outputted, and the section width of the H level is increased/decreased by t for every one increase/decrease of the value of the digital signal. In this case, the digital signal is PWM modulatable, which is correlated to 17 integers included in the value range of not less than −8 and not more than +8, namely, 17 kinds of values such as −8, −7, −6, −5, −4, −3, −2, −1, 0, +1, +2, +3, +4, +5, +6, +7, and +8. In other words, the digital signal having gradations of 17 steps is PWM modulatable by the PWM modulator 13.

Assuming that the MASH type ΔΣ modulator 11 inputs the digital signal correlated to the value +8 to the PWM modulator 13 at a timing of $\tau_{01}$ which corresponds to the boundary between the PWM cycle P1 and the immediately precedent PWM cycle P0. In such case, as shown in the PWM signal S1, a pulse which has a section of H level being a width of 16t in the PWM cycle P1 is outputted. The digital signal, which is correlated to this value +8, is delayed by the delay unit 31 by one cycle T of the PWM cycle and then is inputted to the PWM modulator 13. The limiter 29 outputs to the delay unit 31 the digital signal to be PWM modulated next to the digital signal correlated to +8, at timing when the output of the aforementioned pulse being the H level section width of 16t is started. At this time, the value of the flag being outputted form the flag generator 13b is high (H) (a first flag value) at the timing corresponding to the boundary between the PWM cycle P1 and the immediately preceding cycle (not shown).

The limiter 29 refers to the flag generated by the flag generator 13b at a timing corresponding to a boundary of each PWM cycle, and simultaneously refers to the digital signal (in this example, the digital signal correlated to the value +8) being outputted from itself in the preceding cycle of the PWM cycle, through the feedback via the delay unit 31. Here, the flag is used as a value indicating whether the PWM signal being outputted in the PWM cycle which starts from the timing when the flag is referred is a PWM signal which starts from the H level or a PWM signal which starts from the L level.

The flag will be explained. For example, when the PWM signal in a certain PWM cycle starts from the L level, the section width of the L level must be at least 4t or more by being added to the section width of the L level that exists at a rear end portion of one preceding PWM cycle. In addition, when the PWM signal in a certain PWM cycle starts from the H level, the section width of the H level must be at least 4t or more by being added to the section width of the H level that exists at the rear end portion of one preceding PWM cycle. In the PWM modulation method according to this embodiment, when the value of the flag referenced by the limiter 29 at the timing corresponding to the boundary of the PWM cycle is H, the next PWM cycle starts from the L level. When the value of the flag reference by the limiter 29 is L, the next PWM cycle starts from the H level. That is, the value of the flag at the timing corresponding to the boundary of the PWM cycle and the level of the PWM signal at the head of the next PWM cycle are correlated. The limiter 29 referencing a flag at the timing corresponding to the boundary of the PWM cycle Pi (where the i is an integer), the limiter 29 can judge at a time point when the cycle Pi which is one preceding cycle of the PWM cycle Pi+1 starts whether the PWM signal starts from the H level in the next PWM cycle Pi+1 and has a profile which changes to the section of the L level in that PWM cycle (including the latter boundary of that PWM cycle) or vice versa.

By the aforementioned reference, the limiter 29 recognizes a condition that the PWM signal S1 in the PWM cycle P1 starts from the H level, the section width of the H level within the PWM cycle P1 is 16t, and the section width of the L level within the PWM cycle P1 is 0t (zero). Then, based on this recognition, the limiter 29 judges it necessary that in the PWM signal in the PWM cycle P2, the section of at least 4t from its start should be set as the section of the L level.

In order to secure at least 4t of the section width of the L level in one PWM cycle, the section width of the H level needs to be suppressed to 12t or less in the one PWM cycle. Accordingly, the digital signal that is PWM modulated in that PWM cycle must be expressed as any one of the values, −8, −7, −6, −5, −4, −3, −2, −1, 0, +1, +2, +3, +4, being correlated to the digital signal. That is, in that PWM cycle, the 13 kinds of digital signals being correlated to any one of the 13 integers included in the value range of not less than −8 and not more than +4 is PWM modulatable by the PWM modulator 13. At that time, the digital signal that can be inputted to the PWM modulator 13 has the gradation number of 13 steps.

Hence, when the value of the digital signal being inputted at the timing of $\tau_{01}$ from the adder 27 to the limiter 29 is the value that can not be modulated by the PWM modulator 13 at PWM cycle P2, such as +5, +6, +7, +8, the limiter 29 outputs +4, being an upper limit value of the PWM modulatable value by the PWM modulator 13 in that PWM cycle, to the delay unit 31. Then, the difference (+1, +2, +3 or +4) between the digital signal (+5, +6, +7 or +8) inputted from the adder 27 and a modulatable upper limit value (+4) is sent to the adder 21d as a limit error. The limit error is incorporated into a quantization error occurred in the quantization performed by the first local quantizer 21b, and is suitably distributed to digital signals being outputted from the adder 27 in the next and thereafter PWM cycles, for the sake of an effect of the noise shaping performed by the main loop 21, the sub-loop 23, and the differentiator 27. When it is judged by the limiter 29 that the value of the digital signal being inputted from the adder 27 to the limiter 29 is not more than the upper limit value to be PWM modulatable by the PWM modulator 13 in the PWM cycle, the limiter 29 sends the digital signal to the delay unit 31 as it is, which is inputted from the adder 27 to the limiter 29. In such case, the limit error is not outputted or the value zero is outputted as the limit error.

Next, another example will be explained with reference to FIG. 4(b). This example shows the PWM signal outputted by the PWM modulator 13, when the digital signal being correlated to the value +7 is inputted to the PWM modulator 13 by the MASH type ΔΣ modulator 11 at the timing of $\tau_{01}$.

In this case, the pulse having the section width of the H level of 15t is outputted in PWM cycle P1. The digital signal correlated to the value +7 is delayed by the delay unit 31 by one cycle of the PWM cycle T and is inputted to the PWM modulator 13. At the timing when the output of the pulse of the aforementioned H level section width 15t is started, the limiter 29 outputs the digital signal to the delay unit 31 to be PWM modulated next to the digital signal being correlated to +7. At this time, namely, at the timing of $\tau_{01}$ corresponding to the boundary between the PWM cycle P1 and the immediately preceding cycle P0, the value of the flag outputted by the flag generator 13b is high (H) (first flag value).

The limiter 29 refers to the flag generated by the flag generator 13b at the timing corresponding to the boundary of each PWM cycle, and simultaneously refers to the digital signal (in this example, the digital signal correlated to the value +7) outputted from the limiter 29 itself in the preceding one cycle of the PWM cycle through the feedback via the delay unit 31.

By the aforementioned reference, the limiter 29 recognizes a condition that the PWM signal S2 in the PWM cycle P1 starts from the H level, the section width of the H level within the PWM cycle P1 is 15t, and the section width of the L level within the PWM cycle P1 is 1t. Then, based on this recognition, the limiter 29 judges it necessary that the PWM signal S2 should be set so as to have the section of at least 3t of the L level from the start in the PWM cycle P2.

In order to secure at least 3t of the section width of the L level in one cycle of the PWM cycle, the section width of the H level needs to be suppressed to 13t or less in the one cycle of the PWM cycle. Accordingly, the digital signal that is PWM modulated in that PWM cycle must be any one of −8, −7, −6, −5, −9, −3, −2, −1, 0, +1, +2, +3, +4, +5 when being expressed as a value correlated to the digital signal. That is, 14 kinds of digital signals correlated to any of the 14 integers included in the value range of not less than −8 and not more than +5 are PWM modulatable by the PWM modulator 13 in that PWM cycle. At this time, the digital signal that can be inputted to the PWM modulator 13 is the digital signal having 14 steps of the gradation number.

Therefore, when the value of the digital signal inputted from the adder 27 to the limiter 29 at the timing of $\tau_{01}$ is the value such as +6, +7, +8, that can not be modulated by the PWM modulator 13 in the PWM cycle P2, the limiter 29 outputs +5 to the delay unit 31, which is the upper limit value of the PWM modulatable by the PWM modulator 13 in that PWM cycle. Then, the difference (+1, +2, or +3) between the digital signal (+6, +7, or +8) inputted from the adder 27 and the modulatable upper limit value (+5) is sent to the adder 21d as the limit error. Handling of the limit error thereafter is the same as that described in the example of the PWM signal S1, and hence the explanation thereof is omitted. Also, when it is judged by the limiter 29 that the value of the digital signal inputted in the limiter 29 from the adder 27 is not more than the upper limit value and is PWM modulatable by the PWM modulator 13 in the PWM cycle, similar operation to that described in the example of the PWM signal S1 may be performed.

Next, another example will be explained with reference to FIG. 4(c). This example shows the PWM signal outputted by the PWM modulator 13 in the case that the digital signal being correlated to the value +6 is inputted to the PWM modulator 13 by the MASH type ΔΣ modulator 11 at the timing of $\tau_{01}$ which corresponds to the boundary between the PWM cycle P1 and the immediately preceding PWM cycle P0.

In this case, the pulse having the section width of the H level set at 14t in the PWM cycle P1 is outputted. The digital signal correlated to this value +6 is delayed by the delay unit 31 by one cycle of the PWM cycle T, and then is inputted to the PWM modulator 13. The limiter 29 outputs to the delay unit 31 the digital signal to be PWM modulated next to the digital signal which is correlated to +6. At this time, namely, at the timing corresponding to the boundary between the PWM cycle P1 and the immediately preceding cycle (not shown), the value of the flag being outputted by the flag generator 13b is high (H) (first flag value).

The limiter 29 refers to the flag generated by the flag generator 13b at the timing corresponding to a boundary of each PWM cycle, and simultaneously refers to the digital signal (in this example, the digital signal correlated to the value +6) being outputted by the limiter 29 itself in one preceding cycle of the PWM cycle through the feedback via the delay unit 31.

By the aforementioned reference, the limiter 29 recognizes a condition that a PWM signal S3 in the PWM cycle P1 starts from the H level, the section width of the H level within the PWM cycle P1 is 14t, and the section width of the L level within the PWM cycle S1 is 2t. Then, based on this recognition, the limiter 29 judges it necessary that the PWM signal S3 must be set so as to have at least the section of 2t of the L level from the start of the PWM cycle P2.

In order to secure at least 2t of the section width of the L level in one PWM cycle, the section width of the H level needs to be suppressed to 14t or less in that one PWM cycle. Accordingly, the digital signal that is PWM modulated in this PWM cycle must be any one of values, −8, −7, −6, −5, −4, −3, −2, −1, 0, +1, +2, +3, +4, +5, +6. That is, 15 kinds of digital signals correlated to any one of 15 integers being included in the value range of not less than −8 and not more than +6 is PWM modulatable by the PWM modulator 13 in that PWM cycle. At this time, the digital signal that can be inputted in the PWM modulator 13 is the digital signal having the gradation number of 15 steps.

Therefore, when the value of the digital signal inputted from the adder 27 to the limiter 29 is the value, such as +7, +8, that can not be modulated by the PWM modulator 13 in the PWM cycle P2, the limiter 29 outputs +6 to the delay unit 31 at the timing of $\tau_{01}$, which is the upper limit value of the PWM modulatable value by the PWM modulator 13 in that PWM cycle. Then, the difference (+1 or +2) between the digital signal (+7 or +8) inputted from the adder 27 and the modulatable upper limit value (+6) is sent to the adder 21d as the limit error. The handling of the limit error thereafter is the same as that described in the example of the PWM signal S1, and therefore the explanation thereof is omitted. When it is judged by the limiter 29 that the value of the digital signal inputted from the adder 27 to the limiter 29 is not more than the upper limit value and is PWM modulatable by the PWM modulator 13 in that PWM cycle, similar operation to that described in the example of the PWM signal S1 may be performed.

Next, with reference to PWM signals S4 to S6 shown in FIG. 4(d) to (f), explanation will be given to an operation of the limiter 29 when the flag which is referenced in the output of the digital signal of the limiter 29 is low (L) (second flag value).

FIG. 4(d) to (f) is a diagram of the example of the profile of the pulse (PWM signal) outputted by the PWM modulator 13 in the PWM cycles P2 and P3. As is already described, the digital signal, which is pulse-width modulated in the PWM cycle P2, is the digital signal being outputted by the limiter 29 to the delay unit 31 at the timing of $\tau_{01}$. Similarly, the digital signal, which is pulse-width modulated in the PWM cycle P3, is the digital signal being outputted by the limiter 29 at the timing of $\tau_{12}$ which corresponds to the boundary between the PWM cycle P1 and the PWM cycle P2.

First, the operation of the limiter 29 will be explained, with reference to FIG. 4(d). The limiter 29 refers to the flag generated by the flag generator 13b at the timing of $\tau_{12}$. At this time, the flag is set at low (L) (second flag value). Simultaneously, through the feedback via the delay unit 31, the limiter 29 refers to the digital signal being outputted from the limiter 29 itself in the preceding one cycle of the PWM cycles (in this example, the digital signal correlated to the value −6, expressed as the pulse, with the section width of the L level set at 14t in the PWM cycle P2 in the PWM signal S4 of FIG. 4(*d*)).

By the aforementioned reference, the limiter 29 recognizes a condition that the PWM signal 54 in the PWM cycle P2 starts from the L level, the section width of the L level within the PWM cycle P2 is 14t, and the section width of the H level within the PWM cycle P2 is 2t. Then, based on this recognition, the limiter 29 judges it necessary that the PWM signal S4 should be set so as to have the section of at least 2t of the H level from the start in the PWM cycle P3.

In order to secure at least 2t of the section width of the H level in one cycle of the PWM cycle, the section width of the L level needs to be suppressed to 14t or less in the one cycle of the PWM cycle. Accordingly, the digital signal that is PWM modulated in the PWM cycle must be any one of −6, −5, −4, −3, −2, −1, 0, +1, +2, +3, +4, +5, +6, +7, +8, being expressed by the value correlated to that digital signal. That is, 15 kinds of digital signals being correlated to any one of the 15 integers included in the value range of not less than −6 and not more than +8 is PWM modulatable by the PWM modulator 13 in the PWM cycle. At this time, the digital signal that can be inputted to the PWM modulator 13 is the digital signal having the gradation number of 15 steps.

Hence, when the value of the digital signal being inputted from the adder 27 to the limiter 29 is the value −8, −7 that can not be modulated by the PWM modulator 13 in the PWM cycle P3, the limiter 29 outputs −6 to the delay unit 31, which is a PWM modulatable lower limit value by the PWM modulator 13 in the PWM cycle. Then, the difference (−2, or −1) between the digital signal (−8 or −7) inputted from the adder 27 and the modulatable lower limit value (−6) is sent to the adder 21*d* as the limit error. The handling of the limit error thereafter is the same as that described in the example of the PWM signal S1, and therefore the explanation is omitted. When it is judged by the limiter 29 that the value of the digital signal inputted from the adder 27 to the limiter 29 is not less than the lower limit value and is PWM modulatable by the PWM modulator 13 in the PWM cycle, similar operation to that described in the example of the PWM signal S1 may be performed.

Next, another example will be explained, with reference to FIG. 4(*e*). This example shows the PWM signal outputted by the PWM modulator 13 in the case that the digital signal correlated to the value −7 is inputted to the PWM modulator 13 by the MASH type ΔΣ modulator 11 at the timing of $\tau_{12}$.

In this case, the pulse having the section width of the L level of 15t is outputted in the PWM cycle P2. The digital signal correlated to this value −7 is the digital signal delayed by the delay unit 31 by one PWM cycle T and then inputted in the PWM modulator 13. The limiter 29 outputs to the delay unit 31 the digital signal to be PWM modulated next to the digital signal correlated to −7 at the timing when the output of the pulse of the aforementioned L level section width 15t is started. At that time, namely, at the timing corresponding to the boundary between the PWM cycle P1 and the PWM cycle P2, the value of the flag outputted by the flag generator 13*b* is low (L) (second flag value).

The limiter 29 refers to the flag generated by the flag generator 13*b* at the timing corresponding to a boundary of each PWM cycle, and simultaneously refers to the digital signal (in this example, the digital signal correlated to the value −7) outputted by the limiter 29 itself in the preceding one cycle of the PWM cycle through the feedback via the delay unit 31.

By the aforementioned reference, the limiter 29 recognizes a condition that a PWM signal S5 in the PWM cycle P2 starts from the L level, the section width of the L level within the PWM cycle P2 is 15t, and the section width of the H level within the PWM cycle P2 is it. Then, based on this recognition, the limiter 29 judges it necessary that the PWM signal S5 should be set so as to have the section of at least 3t of the H level from the start in the PWM cycle P3.

In one PWM cycle, in order to secure at least 3t of the section width of the H level, the section width of the L level needs to be suppressed to 13t or less in the PWM cycle. Accordingly, the digital signal that is PWM modulated in this PWM cycle must be any one of −5, −4, −3, −2, −1, 0, +1, +2, +−3, +9, +5, +6, +7, +8. That is, 14 kinds of digital signals correlated to any one of the 14 integers included in the value range of not less than −5 and not more than +8 are PWM modulatable. At this time, the digital signal that can be inputted in the PWM modulator 13 is the digital signal having the gradation number of 14 steps.

Therefore, when the value of the digital signal inputted from the adder 27 to the limiter 29 at the timing of $\tau_{12}$ is the value of −8, −7, −6 that can not be modulated by the PWM modulator 13 in the PWM cycle P3, the limiter 29 outputs −5 to the delay unit 31 which is the PWM modulatable lower limit value by the PWM modulator 13 in that PWM cycle. Then, the difference (−3, −2, or −1) between the digital signal (−8, −7, or −6) inputted from the adder 27 and the modulatable lower limit value (−5) is sent to the adder 21*d* as the limit error. Handling of the limit error thereafter is the same as that described in the example of the PWM signal S1, and therefore the explanation is omitted. Also, when it is judged by the limiter 29 that the value of the digital signal inputted from the adder 27 to the limiter 29 is not more than the upper limit value and is PWM modulatable by the PWM modulator 13 in the PWM cycle, similar operation to that described in the example of the PWM signal S1 may be performed.

Finally, another example will be explained, with reference to FIG. 4(*f*). This example shows the PWM signal being outputted by the PWM modulator 13 in the case that the digital signal correlated to the value −8 is inputted to the PWM modulator 13 by the MASH type ΔΣ modulator 11 at the timing of $\tau_{12}$.

In this case, the pulse having the section width of the L level of 16t is outputted in the PWM cycle P2. The digital signal correlated to this value −8 is delayed by the delay unit 31 by one PWM cycle T, and is inputted to the PWM modulator 13. The limiter 29 outputs to the delay unit 31 the digital signal to be PWM modulated next to the digital signal correlated to −8. At this time, the value of the flag being outputted by the flag generator 13*b* at the timing of $\tau_{12}$ is low (L) (second flag value).

The limiter 29 refers to the flag generated by the flag generator 13*b* at the timing corresponding to a boundary of each PWM cycle, and simultaneously refers to the digital signal (in this example, the digital signal correlated to the value −8) outputted by the limiter 29 itself in the preceding one cycle of the PWM cycles through the feedback via the delay unit 31.

By the aforementioned reference, the limiter 29 recognizes a condition that a PWM signal S6 in the PWM cycle P2 starts from the L level, the section width of the L level within the PWM cycle P2 is 16t, and the section width of the H level within the PWM cycle P2 is zero (0t). Then, based on this recognition, the limiter 29 judges it necessary that the PWM signal S6 should be set so as to have the section of at least 4t of the H level from the first in the PWM cycle P3.

In order to secure at least 4t of the section width of the H level in one PWM cycle, the section width of the L level needs to be suppressed to 12t or less in the one PWM cycle. Accordingly, the digital signal that is PWM modulated in this PWM cycle must be any one of −4, −3, −2, −1, 0, +1, +2, +3, +4, +5, +6, +7, +8, being expressed by the value correlated to the digital signal. That is, 13 kinds of digital signals correlated to any one of the 13 integers included in the value range of not less than −4 and not more than +8 is PWM modulatable. At this time, the digital signal that can be inputted in the PWM modulator 13 is the digital signal having the gradation number of 13 steps.

Therefore, when the value of the digital signal being inputted from the adder 27 to the limiter 29 is the value such as −8, −7, −6, −5, that can not be modulated by the PWM modulator 13 in the PWM cycle P3, the limiter 29 outputs −4 to the delay unit 31 which is the PWM modulatable lower limit value by the PWM modulator 13 in this PWM cycle. Then, the difference (−4, −3, −2 or −1) between the digital signal (−8, −7, −6, or −5) inputted from the adder 27 and the modulatable lower limit value (−4) is sent to the adder 21 as the limit error. Handling of the limit error thereafter is the same as that described in the example of the PWM signal S1, and therefore the explanation is omitted. Also, it is judged by the limiter 29 that the value of the digital signal inputted from the adder 27 to the limiter 29 is not more than the upper limit value and is PWM modulatable by the PWM modulator 13 in the PWM cycle, similar operation to that described in the example of the PWM signal S1 may be performed.

Thus, in the PWM modulation method according to this embodiment, based on the output level of the digital signal that is PWM modulated in the preceding one cycle of the PWM cycle and the PWM signal at the start of this PWM cycle, the gradation number of steps of the digital signal that can be inputted to the PWM modulator in the next PWM cycle is changed. Therefore, in the PWM modulation method according to this embodiment, the digital signal can be inputted to the PWM modulator with the gradation number having the number of steps equal to "(the ratio of the PWM cycle T and the PWM clock t) +1", while limiting the minimum value of the pulse width and the pulse interval in consideration of the response speed of the circuit etc. which uses the output of the PWM modulation. In addition, the error generated due to the change of the gradation number can be suitably distributed by the digital signal output unit to the successive digital signals. Therefore, a quality of D/A conversion is not degraded.

Note that, in this embodiment, it may be accepted the case where the same level is set in an entire one PWM cycle (the case that the pulse such as PWM signals S1 and S6 is used), and thus the PWM modulation methodology is constructed. However, an amount of the change in the gradation number of steps in the PWM cycle being immediately after the cycle in which above mentioned PWM signal is used is relatively larger as compared to the amount in other case. Therefore, it is also probable the case that the limit error being outputted by the limiter 29 in the PWM cycle which is immediately after that cycle may become large and, thus, unstable operation in the MASH type ΔΣ modulator 11 would occur. Therefore, without accepting the use of the pulse such as PWM signals S1 and S6, the gradation number of steps of "(the ratio of the PWM cycle T and the PWM clock t)+1 −2" may be set as a maximum gradation number of steps of the digital signal that can be inputted to the PWM modulator 13. In such a case, the maximum gradation number of steps of the digital signal that can be inputted to the PWM modulator 13 is 15 steps. At this time, the value range correlated to the digital signal is in a range of the integers of not less than −7 and not more than +7. This value range is the value range being configured by excluding the value of both ends of the value range of the not less than −8 and not more than +8, which is the maximum value range that can be modulated by the PWM modulator 13. Further, in this case, a rising or a falling is included within every PWM cycle (with its boundary being not included), and this is advantageous in preventing the deterioration in linearity regarding the output pulse of the PWM modulation.

It is preferable that the signal output in the D/A converter 1a according to this embodiment should be used in a differential output system. In this case, the D/A converter 1a further includes another pulse generator (not shown), and in this another pulse generator, the signal in which its positive/negative sign is inversed in comparison with the signal inputted to the pulse generator 13 is inputted, and this another pulse generator may apply pulse width modulation to this positive/negative inversed signal. Alternately, the signal having a reversed polarity is inputted in this another pulse generator in comparison with the signal inputted in the pulse generator 13, and another pulse generator may apply pulse width modulation to this polarity reversed signal. Then, an output signal of the D/A converter 1a may be generated and used as a difference output, with the difference between the output of the pulse generator 13 and the output of this another pulse generator taken as the difference output.

Note that a digital signal output unit is not limited to the MASH type ΔΣ modulator. There is no limitation in such digital signal output unit only if a device can output the digital signal. Such a device can be used as the digital signal output unit of the present invention.

Modification of First Embodiment

Figure 5:
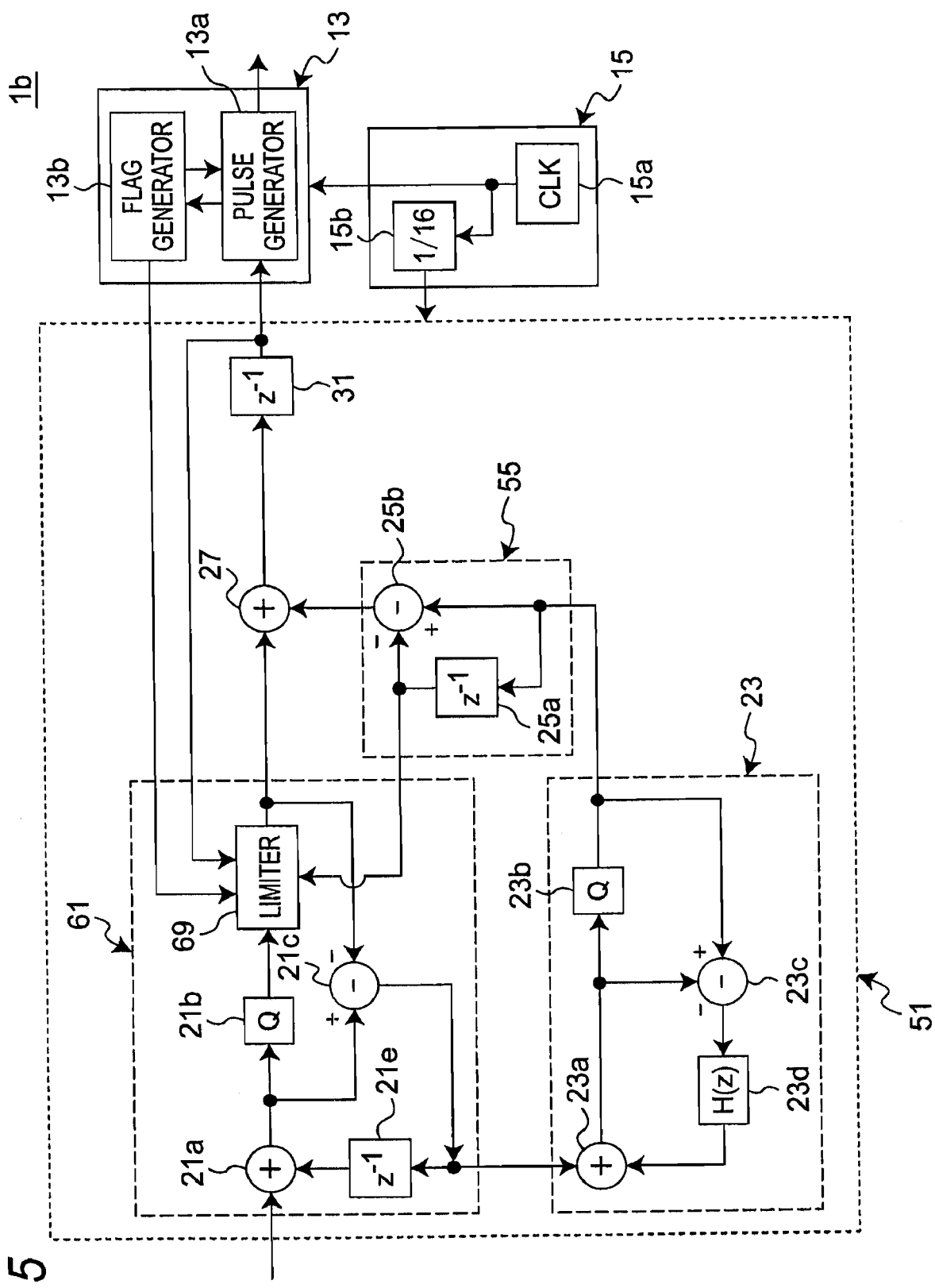
FIG. 5 is a diagram of an example of a modification of the D/A converter according to the first embodiment.

FIG. 5 is a block diagram showing an example of modification of a D/A converter 1b of the first embodiment. With reference to this figure, the modified example of the D/A converter 1b will be explained. Note that the same signs and numerals are assigned to the same constituent element as that of the D/A converter 1a, and the explanation thereof is omitted here.

The D/A converter 1b has a MASH type ΔΣ modulator 51. The MASH type ΔΣ modulator 51 includes a main loop 61, a sub-loop 23, and a differentiator 55. A significant difference from the D/A converter 1a is the point that it has a limiter 69 within the main loop 61 and before the adder 27. The limiter 69 can input the output of a delay unit 25a of the differentiator 55, and, in addition to the aforementioned operation, based on the output of the delay unit 25a further, the limiter 69 limits the output digital signal and can suitably distribute the error being occurred in the limitation to the successive digital signals. If such a limiter 69 is used, a dynamic range regarding the PWM modulation can be expanded, while securing stability of the Mash ΔΣ type D/A converter 51, and this is further advantageous as the D/A converter.

Second Embodiment

Figure 6:
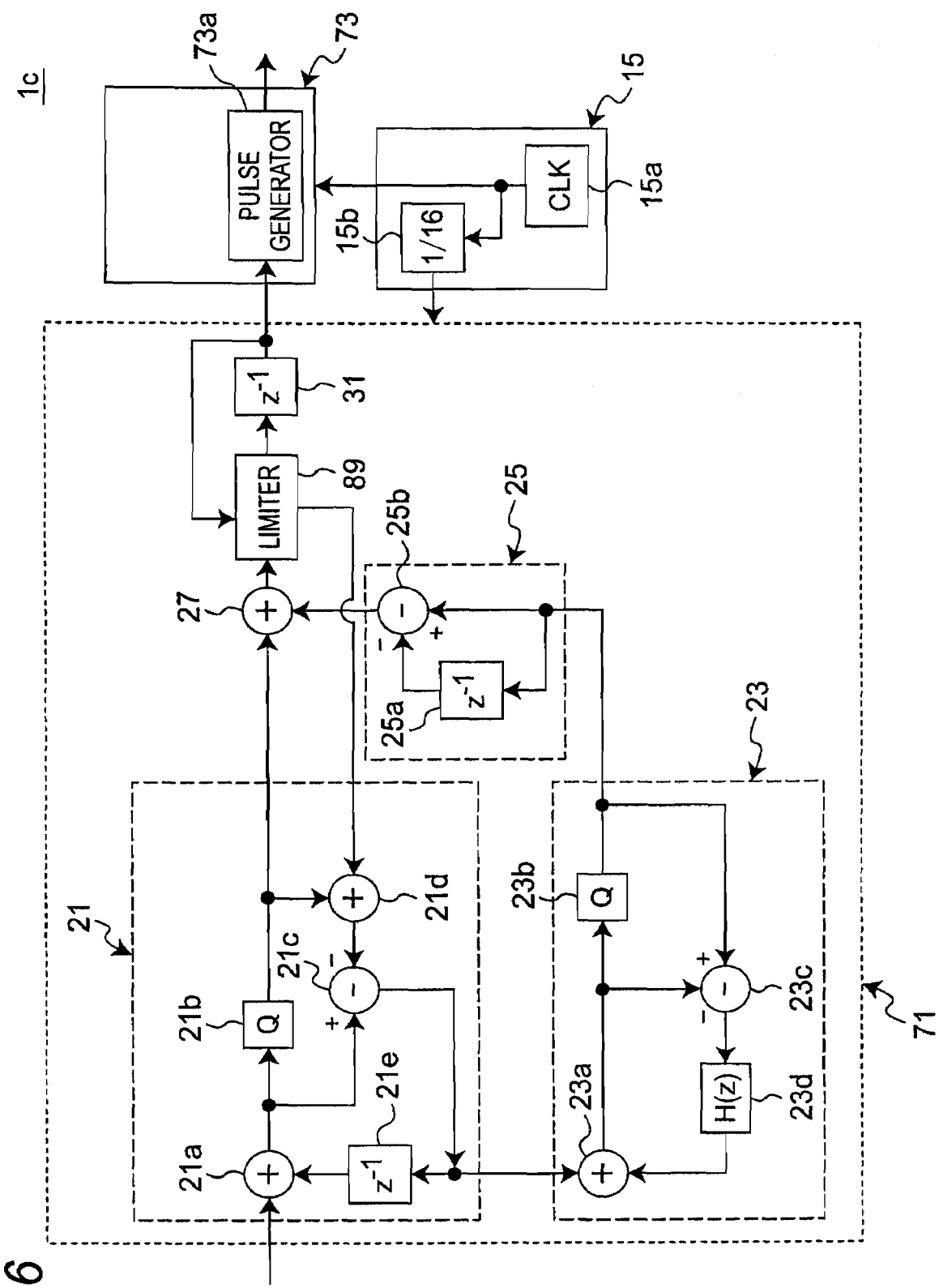
FIG. 6 is a diagram of a D/A converter according to second or third embodiment.

FIG. 6 is a block diagram of a digital-analogue converter (D/A converter) 1c according to a second embodiment of the present invention. The D/A converter 1c is the delta-sigma (ΔΣ) type D/A converter in the same way as the D/A converter 1a. The explanation for the same constituent element as that of the D/A converter 1a is omitted in the description about the D/A converter 1c. Also, regarding the same operation of each constituent element as that of the D/A converter 1a according to the first embodiment, the explanation thereof is simplified or omitted.

When the D/A converter 1c being compared to the D/A converter 1a according to the first embodiment, the flag generator is omitted from a PWM modulator 73 of the D/A converter 1c, and along with this omission, the input of the flag to a limiter 89 is also omitted. The D/A converter 1c according to the second embodiment corresponds to the D/A converter 1a according to the first embodiment except for the aforementioned point. Based on the digital signal having outputted from itself to the delay unit 31 in one preceding cycle of the PWM cycle and the digital signal being inputted from the adder 27, the limiter 89 included in a MASH type $\Delta\Sigma$ modulator 71 determines the value of the digital signal to output to the delay unit 31 and the value of the digital signal to output to the adder 21d, and can output these values to the delay unit 31 and the adder 21d, respectively.

Figure 7:
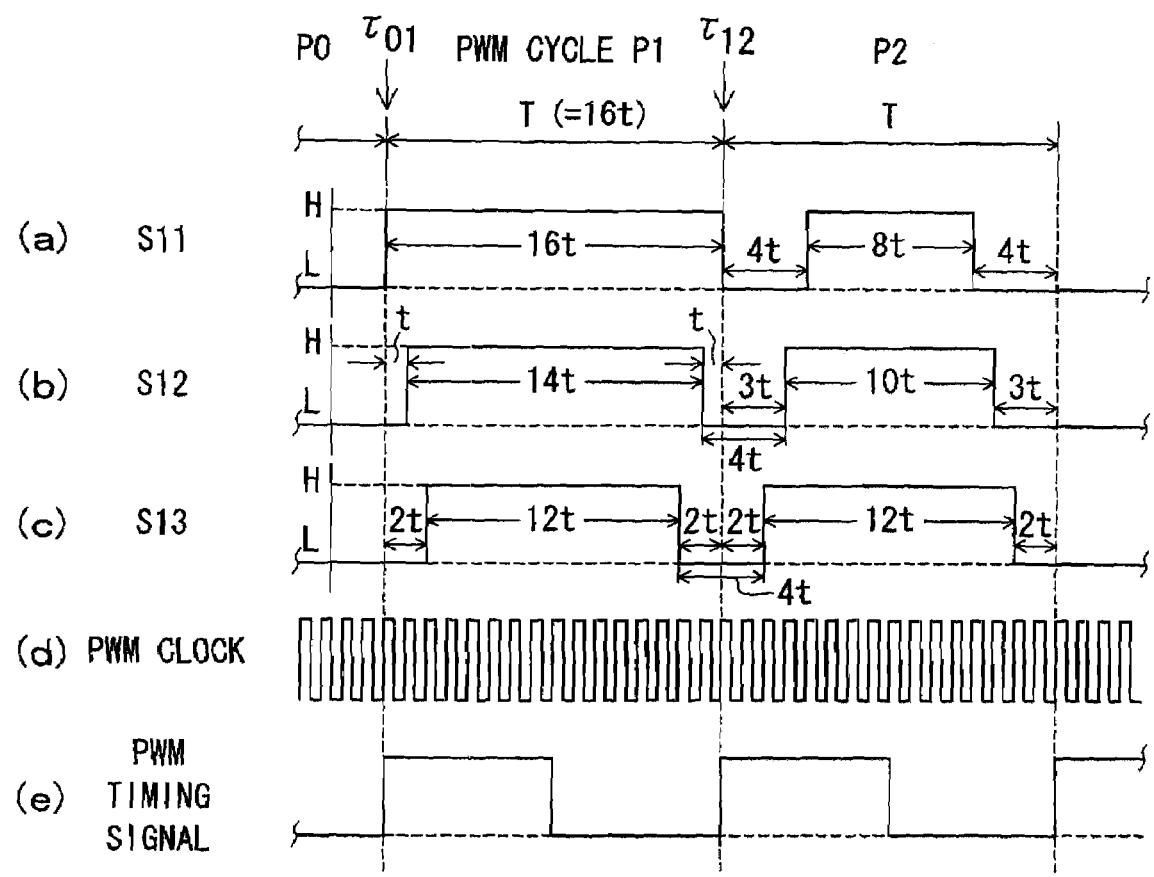
FIG. 7 is a diagram of an output example of PWM signals by PWM modulation method according to the second embodiment.

FIG. 7(a) to (c) is a diagram of several examples of the PWM signals (pulses) being outputted from a pulse generator 73a of the PWM modulator 73. FIG. 7(d) to (e) is a diagram of the PWM clock and the PWM timing signal being outputted by the clock signal generator 15. With reference to these figures, the PWM modulation according to this embodiment will be explained. In the same way as the first embodiment, the interval of PWM clocks is represented as t, and the interval of PWM timing signals is represented by 16t (where 16t=T, T is the PWM cycle.).

In the same way as the first embodiment, also in this embodiment, the section in which H level is outputted and the section in which the L level is outputted are limited so as to have the section width of at least 4 clocks of the PWM clock (4t) In addition, in the PWM modulation method according to this embodiment, continuance between the section of the first signal in a certain PWM cycle and the section of the first signal in the next PWM cycle is prohibited. Thus, as described above, the immediate level change of the PWM signal exceeding the response speed of the circuit etc. such as the MOS driver which uses the output of the PWM modulator 73 is prevented, and stable operation of such device is secured. Further, unlike the first embodiment, in this embodiment, the pulse of the PWM signal is always outputted so as to have a waveform being symmetric about a midpoint on the time axis of each PWM cycle. Therefore, power centers of the PWM signals are identical to each other through the entire PWM cycles. In addition, in each PWM cycle, the section of the first signal inevitably has two edges (the rising and the falling), and the deterioration of the linearity regarding the area of the pulse of the PWM signal is prevented with further good accuracy.

In this example also, the PWM cycle T is expressed by T=16t (the PWM cycle is 16 times of the cycle of the PWM clock). In this case, the PWM signal in one PWM cycle has 9 kinds of section widths of the H level from 0t to 16t on 2t basis. Here, when the digital signal correlated to the value zero is inputted in the PWM modulator 73, the pulse having equal section width of the H level in one cycle of the PWM cycle to the section width of the L level in the same one cycle of the PWM cycle is outputted. Then, for every one increase/decrease of the value correlated to the digital signal, the section width of the H level is increased/decreased by 2t. At this time, the digital signal is PWM modulatable by the PWM modulator 73 which is correlated to 9 integers included in the value range of not less than −4 and not more than +4, namely, 9 kinds of values such as −4, −3, −2, −1, 0, +1, +2, +3, +4. In other words, the digital signal having the gradation number of 9 steps is PWM modulatable by the PWM modulator 73.

Alternatively, the digital signal may be PWM modulated so as to have the section width of the H level of 4t or more inevitably in each cycle. In this case, 7 kinds of the section widths of the H level, from 4t up to 16t on 2t basis, are possible. When the digital signal being correlated to the value zero is inputted to the PWM modulator 73, the pulse having the H level of the section width of 10t is outputted. And assuming that, for every one increase/decrease of the value shown by the digital signal, the section width of the H level is increased/decreased by 2t, the digital signal being correlated to 7 integers included in the value range of not less than −3 and not more than +3, namely, 7 kinds of values such as −3, −2, −1, 0, +1, +2, +3 is PWM modulatable. In other words, the digital signal having the gradation number of 7 steps is PWM modulatable.

First, FIG. 7(a) is referenced. The digital signal being correlated to the value +4 is inputted to the PWM modulator 73 by the MASH type $\Delta\Sigma$ modulator 71 at the timing of $\tau_{01}$ corresponding to the boundary between the PWM cycle P1 and the immediately preceding PWM cycle (not shown). The pulse having the section width of the H level of 16t is outputted by the PWM modulator 73 in the PWM cycle P1. At the timing corresponding to the boundary between the PWM cycle P1 and the immediately preceding PWM cycle (not shown), through the feedback from the delay unit 31, the limiter 89 in the MASH type $\Delta\Sigma$ modulator 71 receives the digital signal correlated to the value +4 (the digital signal having outputted to the delay unit 31 by the limiter 89 itself at the start of the immediately preceding PWM cycle), and simultaneously receives the digital signal from the adder 27. The limiter 89 refers to the digital signal having outputted to the delay unit 31 by the limiter 89 itself and the digital signal inputted from the adder 27, and determines the digital signal to output to the delay unit 31 and the digital signal to output to the adder 21d, respectively.

By the aforementioned reference, the limiter 89 recognizes that a PWM signal S11 in the PWM cycle P1 has the section width of the H level of 16t in the PWM cycle P1 and the section width of the L level of 0t (zero) in the PWM cycle P1. Then, based on this recognition, the limiter 89 judges that, in the PWM signal 511, the section of at least 4t from the start of the PWM cycle P2 and the section of at least 4t up to the end need to be set as the section of the L level in the PWM cycle P2.

In order to secure the sections of the L level of at least 4t in both portions of the start and the end of the PWM cycle P2, the section width of the H level needs to be suppressed to 8t or less in this PWM cycle. Accordingly, the digital signal that is PWM modulated in this PWM cycle must be any one of −4, −3, −2, −1, 0, being expressed by the value correlated to the digital signal. That is, in this PWM cycle, 5 kinds of digital signals being correlated to any one of the 5 integers included in the value range of not less than −4 and not more than 0 are PWM modulatable by the PWM modulator 73. At this time, the digital signal that can be inputted to the PWM modulator 73 is the digital signal having the gradation number of 5 steps.

Therefore, when the value of the digital signal being inputted from the adder 27 to the limiter 89 is the value, such as +1, +2, +3, +4, that can not be modulated by the PWM modulator 73 in the PWM cycle P2, the limiter 89 outputs 0 to the delay unit 31 which is the upper limit value of the PWM modulatable value by the PWM modulator 73 in this PWM cycle. Then, the difference (+1, +2, +3, or +4) between the digital signal being inputted from the adder 27 (+1, +2, +3, or +4) and the modulatable upper limit value (0) is sent to the adder 21d as the limit error. Note that, when the correlation of the value and the digital signal is changed, the limiter 89 outputs −2, being the lower limit value, or +2, being the upper limit value of the PWM modulatable value by the PWM modulator 73 in this PWM cycle in case where the value of the digital signal being inputted from the adder 27 to the limiter 89 is −4 or −3, or +3 or +4. Then, the difference (−2 or −1, or +1 or +2) between the digital signal being inputted from the adder 27 (−4 or −3, or +3 or +4) and the modulatable lower limit value (−2) or the modulatable upper limit value (+2) may be sent to the adder 21d as the limit error.

Next, FIG. 7(b) is referenced. This example shows the PWM signal being outputted by the PWM modulator 73 in the case where the digital signal being correlated to the value +3 is inputted to the PWM modulator 73 by the MASH type ΔΣ modulator 71 at the timing of $\tau_{01}$. In this case, the pulse having the section width of the H level of 14t is outputted in the PWM cycle P1.

The limiter 89 recognizes that the section width of the H level of a PWM signal S12 is 14t in the PWM cycle P1, and the section width of the L level is 1t in the PWM cycle P1 at the rear end. Then, based on this recognition, the limiter 89 judges that the PWM signal S12 should have the section of the L level of at lest 3t from the start of the PWM cycle P2 and the section of the L level of at least 3t up to the end in the PWM cycle P2.

In order to secure the sections of the L level of at least 3t in both portions of the start and the rear end of the PWM cycle P2, the section width of the H level should be suppressed to 10t or less in this PWM cycle.

Accordingly, the digital signal that is PWM modulated in this PWM cycle must be any one of −4, −3, −2, −1, 0, +1, being expressed by the value correlated to the digital signal. That is, 6 kinds of digital signals correlated to any one of the 6 integers included in the value range of not less than −4 and not more than +1 are PWM modulatable by the PWM modulator 73 in this PWM cycle. At this time, the digital signal that can be inputted in the PWM modulator 73 is the digital signal having the gradation number of 6 steps.

Therefore, at the timing of $\tau_{01}$, when the value of the digital signal inputted from the adder 27 to the limiter 89 is the value, such as +2, +3, +4, that can not be modulated by the PWM modulator 73 in the PWM cycle P2, the limiter 89 outputs +1 to the delay unit 31 which is the PWM modulatable upper limit value by the PWM modulator 73 in this PWM cycle. Then, the difference (+1, +2, or +3) between the digital signal inputted from the adder 27 (+2, +3, or +4) and the modulatable upper limit value (+1) is sent to the adder 21d as the limit error. At this time, as explained before, the correlation of the value and the digital signal may be changed. The processing in such case may be similar processing to that described above.

Next, FIG. 7(c) is referenced. This example shows the PWM signal being outputted by the PWM modulator 73 in the case where the digital signal correlated to the value +2 is inputted to the PWM modulator 73 by the MASH type ΔΣ modulator 71 at the timing of $\tau_{01}$. In this case, the pulse having the section width of the H level of 12t is outputted in the PWM cycle P1.

The limiter 89 recognizes that the section width of the H level is 12t in the PWM cycle P1 of a PWM signal S13, and the section width of the L level of the rear end of the PWM cycle P1 is 2t. Then, based on this recognition, the limiter 89 judges that the PWM signal S13 in the PWM cycle P2 should have the section of the L level of at least 2t from the start of the PWM cycle P2 and the section of the L level of at least 2t up to the end.

In order to secure the section of the L level of at least 2t in both portions of the start and the rear end of the PWM cycle P2, the section width of the H level should be suppressed to 12t or less, in this PWM cycle. Accordingly, the digital signal that is PWM modulated in this PWM cycle must be any one of −4, −3, −2, −1, 0, +1, +2, being expressed by the value correlated to the digital signal. That is, 7 kinds of digital signals correlated to any one of the 7 integers included in the value range of not less than −4 and not more than +2 are PWM modulatable by the PWM modulator 73 in this PWM cycle. At this time, the digital signal that can be inputted in the PWM modulator 73 is the digital signal having the gradation number of 7 steps.

Hence, when the value of the digital signal inputted from the adder 27 to the limiter 89 at the timing corresponding to the boundary between the PWM cycle P1 and the immediately preceding cycle (not shown) is the value, such as +3, +4, that can not be modulated by the PWM modulator 73 in the PWM cycle P2, the limiter 89 outputs +2 to the delay unit 31 which is the upper limit value of the PWM modulatable value by the PWM modulator 73 in this PWM cycle. Then, the difference (+1, or +2) between the digital signal (+3, or +4) inputted from the adder 27 and the modulatable upper limit value (+2) is sent to the adder 21d as the limit error. At this time, the correlation between the value and the digital signal may be done as explained above. The processing in such case may be similar processing to that as described above.

Thus, in the PWM modulation method according to this embodiment, based on the digital signal that is PWM modulated in the one preceding cycle of the PWM cycle, the gradation number of steps of the digital signal that can be inputted in the PWM modulator in the next PWM cycle is changed. Therefore, in the PWM modulation method according to this embodiment, the digital signal with the gradation number of steps being equal to "(the ratio of the PWM cycle T and the PWM clock t)/2+1" can be inputted to the PWM modulator, while limiting the minimum values of the pulse width and the pulse interval in consideration of the response speed of the circuit etc. which uses the output of the PWM modulation. In addition, the error occurred due to the change of the gradation number of steps can be suitably distributed to the successive digital signals at the digital signal output unit, and therefore the quality of the D/A conversion is not degraded.

Figure 8:
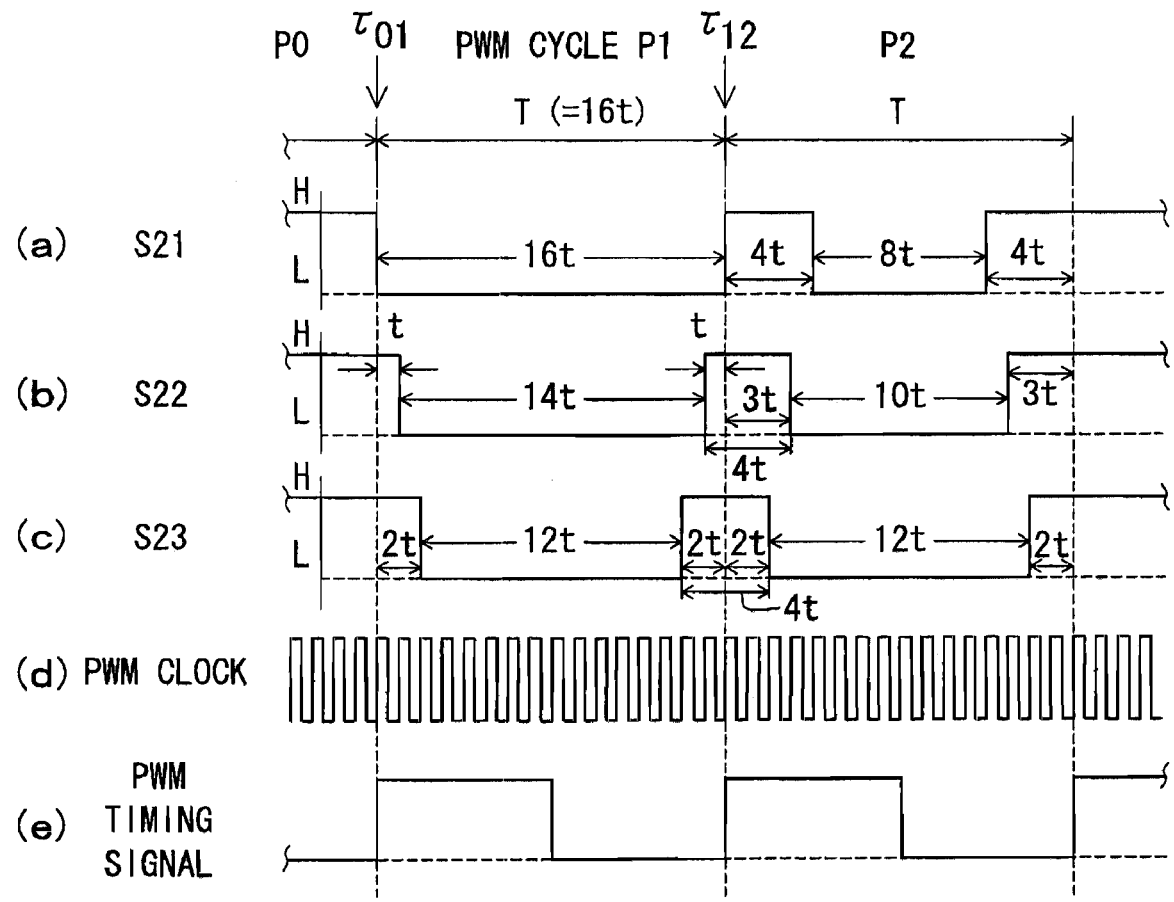
FIG. 8 is a diagram of another output example of the PWM signals by the PWM modulation method according to the second embodiment.

In the second embodiment, explanation is given heretofore by using a model in which the levels on the boundaries of the PWM cycle are identical with each other at the L level. However, in the PWM modulation method according to the present invention, as a matter of course, as shown in FIG. 8(a) to (c), it is also possible to be used in a model in which the levels on the boundaries of the PWM cycle is identical with each other at the H level.

Note that in this embodiment, it may be accepted the case where the same level is set in an entire one PWM cycle (the case that the pulse such as a PWM signal S11 (FIG. 7) and a PWM signal S21 (FIG. 8) is used), and thus the PWM modulation methodology is constructed. However, an amount of the change in the gradation number of steps in the PWM cycle being immediately after the cycle in which above mentioned PWM signal is used is relatively larger as compared to the amount in other cases. Therefore, the limit error being outputted by the limiter 89 is made larger in the immediately following PWM cycle, and in some cases, there is a possibility that unstable operation in the MASH type ΔΣ modulator 71 would occur. Therefore, without allowing the use of the pulse such as the PWM signals S11 and S21, the gradation number of steps of "(the ratio of the PWM cycle T and the PWM clock t)/2+1−2" may be set as a maximum gradation number of steps of the digital signal that can be inputted to the PWM modulator 73. In such a case, the maximum gradation number of steps (largest value range) of the digital signal that can be inputted to the PWM modulator 73 is 7 steps.

Third Embodiment

Figure 9:
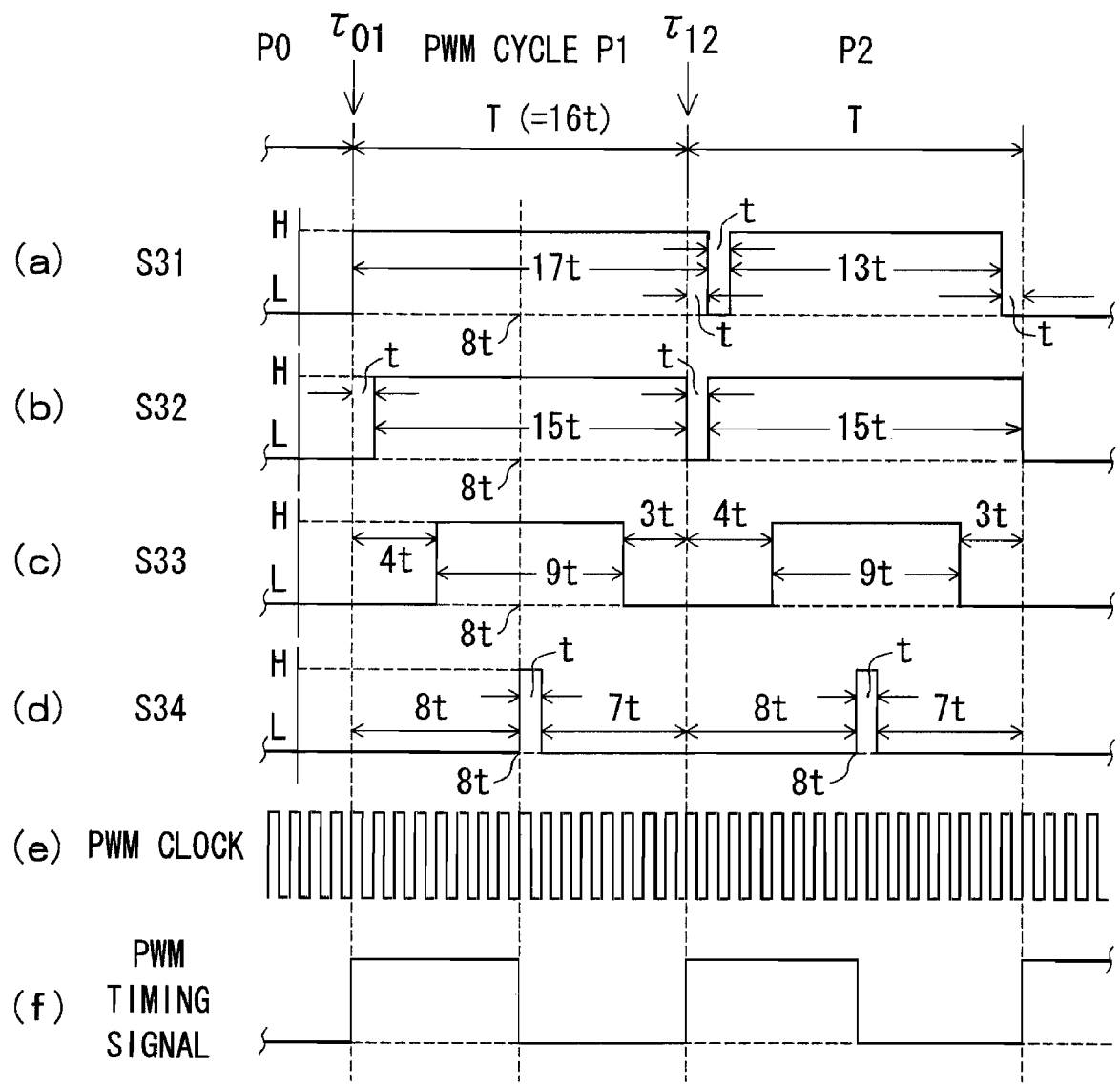
FIG. 9 is a diagram of an output example of PWM signals by PWM modulation method according to the third embodiment.

In the PWM modulation method according to a third embodiment, the D/A converter 1c having the same configuration as that of the second embodiment can be used. Therefore, explanation for the configuration of the D/A converter 1c according to the third embodiment is omitted. FIG. 9 shows examples (S31 to S34) of the PWM signal (pulse) being outputted by the pulse generator 73a of the PWM modulator 73 and the PWM clock being outputted by the clock signal generator 15 and the PWM timing signal. With reference to this figure, the PWM modulation according to this embodiment will be explained. In the same way as the first and second embodiments, the interval of PWM clocks is represented as t, and the interval of PWM timing signals is represented as 16t (where 16t=T, T is the PWM cycle).

In this embodiment, the section where the H level as the first level is outputted and the section where the L level as the second level is outputted are limited so as to have the section width of at least one clock (1t) of the PWM clock. In addition, in the same way as the second embodiment, the continuance between the first signal section and the next first signal section is prohibited. Thus, as described above, the immediate level change of the PWM signal exceeding the response speed of the circuit etc. such as the MOS driver which uses the output of the PWM modulator 73 is prevented to secure a stable operation of such device. In addition, the deterioration in linearity regarding the area of the pulse of the PWM signal is prevented. Further, unlike the second embodiment, in this embodiment, the pulse of the PWM signal is always outputted so as to have a waveform symmetric about a point shifted behind by 0.5t from the midpoint of each PWM cycle on the time axis. Then, an output value of the PWM signal is determined based on the size of each first signal section which included in the successive two PWM cycles (such as an area of the pulse from the rising to the falling in two successive PWM cycles). Thus, the power centers of the PWM signals are made identical with each other in all PWM cycles, and the pulse of the H level inevitably exists in the vicinity of the time center of each PWM cycle. Therefore, even when the digital signal being correlated to the minimum value is inputted, the pulse having the rising and the falling is outputted. At the same time the method according to the present embodiment has the same gradation number of steps of the digital signal that can be inputted as that of the second embodiment. Accordingly, the linearity regarding the pulse of the PWM signal is further improved.

According to FIG. 7(a) to (c) and FIG. 9(a) to (d), it is found that a section width of the first signal in this embodiment has a section width which is enlarged by 1 t with compared to the first section width according to the second embodiment. Therefore, as shown in a PWM signal S31, depending on the digital signal inputted in the PWM modulator 73, the section width of the first signal may sometimes be larger than the width of the PWM cycle. Therefore, in this embodiment, the output value of the PWM signal is determined based on the area from the rising to the falling of each pulse that exists within two successive PWM cycles.

FIG. 9(a) is referenced again. The PWM signal S31 shows the PWM signal being outputted in the case where the digital signal correlated to the value +4 is inputted to the PWM modulator 73 by the MASH type ΔΣ modulator 71 at the timing of $\tau_{01}$. The PWM signal S31 has the first signal section having the section width of 17t in a whole region of the PWM cycle P1 and a starting portion of the PWM cycle P2. At the timing corresponding to the boundary between the PWM cycle P1 and the immediately preceding PWM cycle (not shown), the limiter 89 of the MASH type ΔΣ modulator 71 receives the digital signal correlated to the value +4 (the digital signal having outputted to the delay unit 31 by the limiter 89 in the start of the immediately preceding PWM cycle) through the feedback from the delay unit 31, and simultaneously receives the digital signal from the adder 27. The limiter 89 refers to the digital signal having been outputted to the delay unit 31 by the limiter 89 and the digital signal inputted from the adder 27, and determines the digital signal to output to the delay unit 31 and the digital signal to output to the adder 21d.

By the aforementioned reference, the limiter 89 recognizes that the PWM signal S31 has the section width of the H level of 16t within the PWM cycle P1, and further the section of the H level with a section width of 1t continuously exists in the starting portion of the PWM cycle P2. Then, based on this recognition, the limiter 89 judges that the PWM signal S31 should have the section of the L level of 1t from the time point of 1t of the PWM cycle P2 and the section of the L level of 1t from 15t to the end of the PWM cycle P2.

Therefore, the section width of the H level which constitutes the pulse included in the PWM cycle P2 should be suppressed to 13t or less. Accordingly, the digital signal that is PWM modulated in this PWM cycle must be any one of −4, −3, −2, −1, 0, +1, +2, being expressed as the value correlated to the digital signal. Namely, 7 kinds of digital signals correlated to any one of 7 integers included in the value range of not less than −4 and not more than +2 are PWM modulatable by the PWM modulator 73 in this PWM cycle. At this time, the digital signal that can be inputted in the PWM modulator 73 is the digital signal having the gradation number of 7 steps.

Therefore, in the case where the value of the digital signal inputted from the adder 27 to the limiter 89 at the timing of $\tau_{01}$ is the value such as +3, +4, that can not be modulated by the PWM modulator 73 in the PWM cycle P2, the limiter outputs +2 to the delay unit 31 which is the PWM modulatable upper limit value by the PWM modulator 73 in this PWM cycle. Then, the difference (+1 or +2) between the digital signal (+3 or +4) inputted from the adder 27 and the modulatable upper limit value (+2) is sent to the adder 21d as the limit error.

Next, FIG. 9(b) is referenced. This example shows the PWM signal being outputted by the PWM modulator 73, when the digital signal correlated to the value +3 is inputted in the PWM modulator 73 by the MASH type ΔΣ modulator 71, at the timing of $\tau_{01}$. In this case, the pulse having the section width of the H level of 15t in the PWM cycle P1 is outputted.

The limiter 89 recognizes that the PWM signal S32 has the section width of the H level of 15t within the PWM cycle P1, and the section width of the L level of zero (0t) at the rear end portion of the PWM cycle P1. Then, based on this recognition, the limiter 89 judges that the PWM signal S32 in the PWM cycle P2 should have the section width of the L level of at least 1t from the start of the PWM cycle P2, and the section of the L level of at least 1t up to the rear end.

Therefore, the section width of the H level constituting the pulse included in the PWM cycle P2 should be suppressed to 15t or less. Accordingly, the digital signal that is PWM modulated in this PWM cycle must be any one of −4, −3, −2, −1, 0, +1, +2, +3, being expressed as the value correlated to the digital signal. That is, 8 kinds of digital signals correlated to any one of 8 integers included in the value range of not less than −4 and not more than +3 are PWM modulatable by the PWM modulator 73 in this PWM cycle. At this time, the digital signal that can be inputted in the PWM modulator 73 is the digital signal having the gradation number of 8 steps.

Therefore, in the case where the value of the digital signal inputted from the adder 27 to the limiter 89 is the value such as +4 that can not be modulated by the PWM modulator 73 in the PWM cycle P2, the limiter 89 outputs +3 to the delay unit 31 which is the upper limit value that is PWM modulatable by the PWM modulator 73 in this PWM cycle. Then, the difference (+1) between the digital signal (+4) inputted from the adder 27 and the modulatable upper limit value (+3) is sent to the adder 21d as the limit error.

Next, FIG. 9(c) is referenced. This example shows the PWM signal being outputted by the PWM modulator 73 when the digital signal correlated to the value 0 is inputted to the PWM modulator 73 by the MASH type ΔΣ modulator 71 at the timing corresponding to the boundary between the PWM cycle P1 and the immediately preceding PWM cycle (not shown). In this case, the pulse having the section width of the H level of 9t in the PWM cycle P1 is outputted.

The limiter 89 recognizes that a PWM signal S33 in the PWM cycle P1 has the section width of the H level of 9t within the PWM cycle P1, and the section width of the L level of 3t in the rear end portion of the PWM cycle P1. Then, based on this recognition, the limiter 89 judges that the PWM signal S33 may not necessarily have the section of the L level at the start portion of the PWM cycle P2.

In this case, the section of the L level does not have to be secured in both portions of the start and the rear end of the PWM cycle P2. Accordingly, the digital signal that is PWM modulated in this PWM cycle may be any one of −4, −3, −2, −1, 0, +1, +2, +3, +4, being expressed as the value correlated to the digital signal. That is, 9 kinds of digital signals correlated to any one of the 9 integers included in the value range of not less than −4 and not more than +4 are PWM modulatable by the PWM modulator 73 in this PWM cycle. At this time, the digital signal that can be inputted in the PWM modulator 73 is the digital signal having the gradation number of 9 steps.

Therefore, the value of the digital signal being inputted from the adder 27 to the limiter 89 at the timing corresponding to the boundary between the PWM cycle P1 and the immediately preceding cycle (not shown) is outputted as it is to the delay unit 31 by the limiter 89.

Finally, FIG. 9(d) is referenced. This example shows the PWM signal outputted by the PWM modulator 73 when the digital signal correlated to the value −4 is inputted to the PWM modulator 73 by the MASH type ΔΣ type modulator 71 at the timing of $\tau_{01}$. In this case, the pulse having the section width of the H level of 1t in the PWM cycle P1 is outputted. Thus, in the PWM modulation method according to this embodiment, the pulse having the rising and the falling is outputted even when the digital signal correlated to the minimum value of the value range of the value that can be inputted in the PWM modulator 73 is inputted. Therefore, the linearity of the output value of the PWM signal is improved.

The limiter 89 recognizes that the PWM signal S34 in the PWM cycle P1 has the section width of the H level of 1t within the PWM cycle P1, and the section width of the L level of 7t in the end portion of the PWM cycle P1. Then, based on this recognition, the limiter 89 judges that the PWM signal S34 may not necessarily have the section of the L level at the start portion of the PWM cycle P2.

Therefore, in the same way as a case of the PWM cycle P2 of the PWM signal S33, the value of the digital signal being inputted from the adder 27 to the limiter 89 is outputted as it is to the delay unit 31 by the limiter 89 at the timing of $\tau_{01}$.

Thus, in the PWM modulation method according to this embodiment, the output value of the PWM modulation is determined using two successive PWM cycles. Therefore, a PWM modulation output value can be expressed by using a pulse having the section width of one or more cycles of the PWM cycle. In addition, the pulse having one rising and one falling at least is outputted in one cycle of the PWM cycle, and this is advantageous in the point of securing the linearity in the output value of the PWM modulation.

Figure 10:
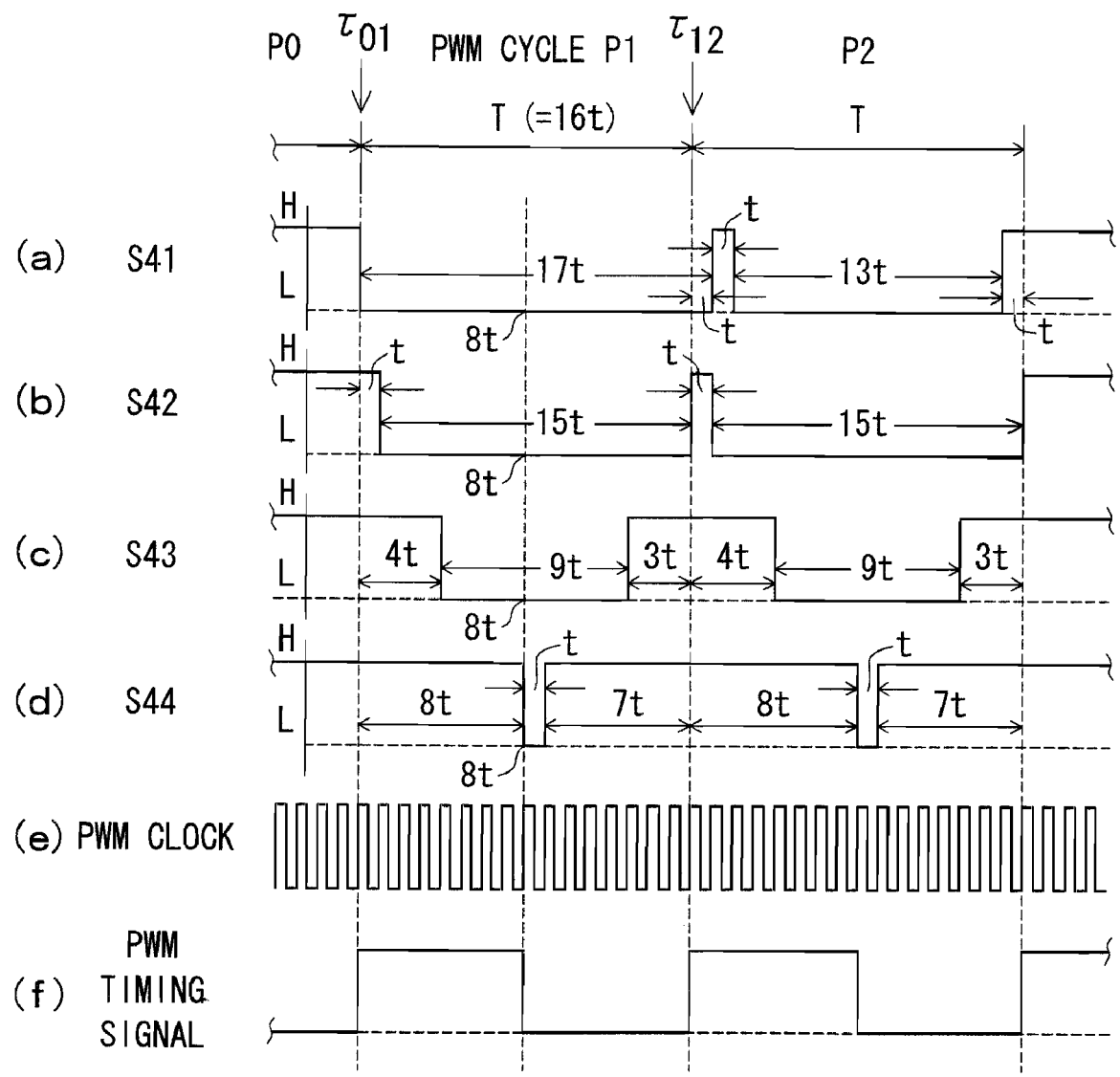
FIG. 10 is a diagram of another output example of the PWM signals by the PWM modulation method according to the third embodiment.

Explanation has been given heretofore by using a model that the pulse of the H level exists in the vicinity of the time center of the PWM cycle. However, in the PWM modulation method according to the present invention, as shown in FIG. 10, a model in which the section of the L level inevitably exists in the vicinity of the time center of the PWM cycle can also be used.

Modified Example of The Second and Third Embodiments

Figure 11:
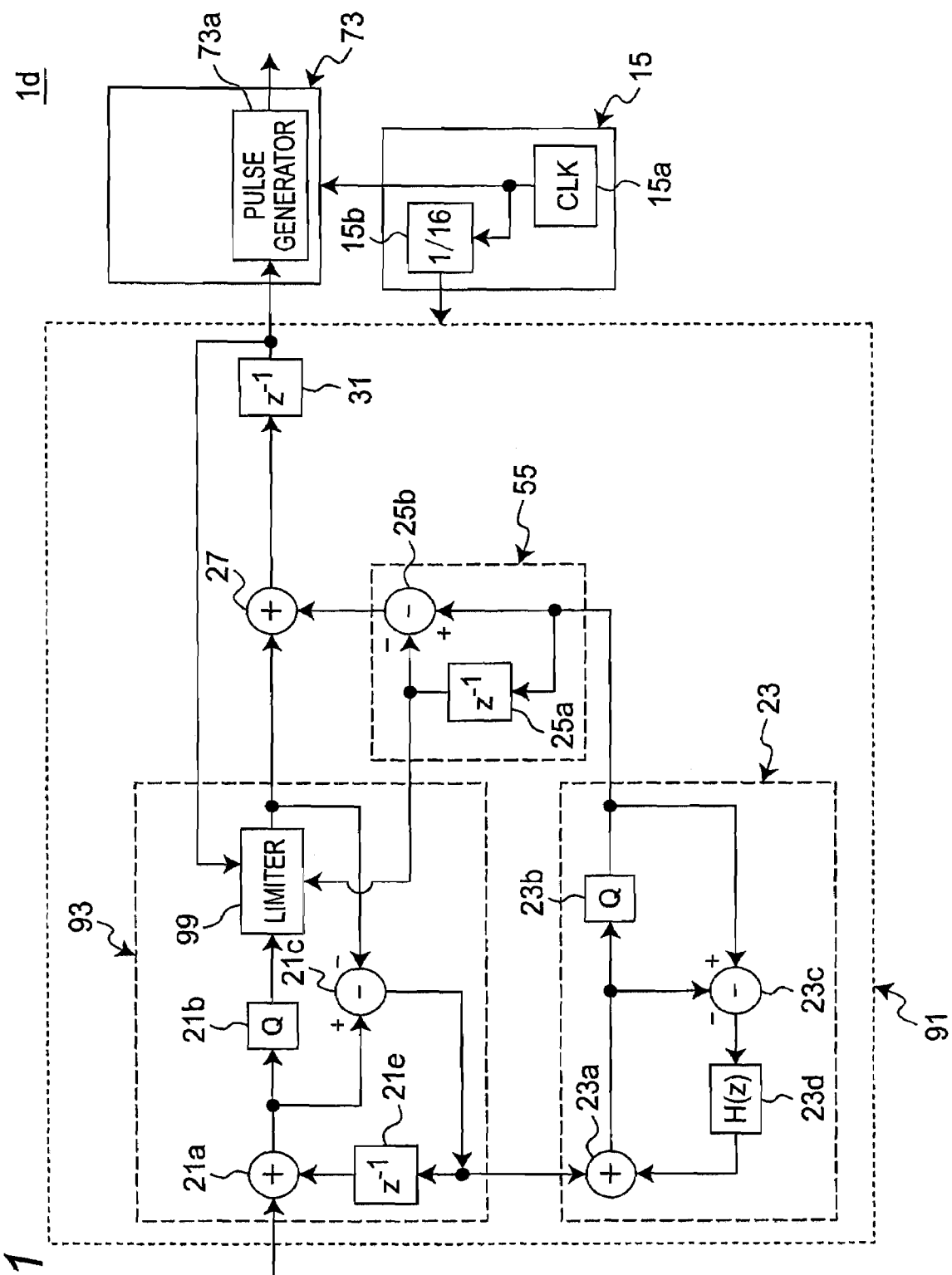
FIG. 11 is a diagram of an example of a modification of the D/A converter according to the second or the third embodiment.

FIG. 11 is a block diagram of a modified example 1d of the D/A converter 1c being capable of using the PWM modulation method according to the second and third embodiments.

The D/A converter 1d has a MASH type ΔΣ modulator 91. The MASH type ΔΣ modulator 91 includes a main loop 93, a sub-loop 23, and a differentiator 55. In the same way as the D/A converter 1b (FIG. 5), the D/A converter 1d has a limiter 99 within the main loop 93 in front of the adder 27. The limiter 99 can input the output from a delay unit 25a of the differentiator 55, and the limiter 99 can limit the digital signal to be outputted based on the output of the delay unit 25a in addition to the aforementioned operation, and can suitably distribute the error due to the limitation to the successive digital signals. When such limiter 99 is used, the dynamic range of the PWM modulation can further be broadened while securing the stability of the MASH type ΔΣ modulator 91, and this is further advantageous as the D/A converter.

Note that also in this embodiment, the digital signal output unit is not limited to the MASH type ΔΣ modulator. There is no limitation, provided that the digital signal can be outputted, and such digital signal output unit can be used as the digital signal output unit according to the present invention.

The PWM modulation method according to the present invention, in a system in which there exists the above mentioned limitation regarding a minimum pulse width, is capable of suppressing to minimum a reduction of the gradation number of steps (dynamic range) of the digital signal that can be inputted due to such limitation, and is capable of widely taking the gradation number of steps of the digital signal that can be PWM modulated. This method is useful as the PWM modulation method in the D/A converter.

What is claimed is:

1. A pulse width modulation method, which modulates a digital signal and generates a pulse width modulation signal in a pulse width modulator, by using a digital signal output unit which receives an input signal on a cycle basis and outputs the digital signal corresponding to the input signal and the pulse width modulator which is capable of modulating the digital signal, the value of which is included in a prescribed value range in synchronization with the cycle, the pulse width modulation method comprising:

outputting to the pulse width modulator a first value corresponding to the input signal as a first digital signal at a first timing by the digital signal output unit;

determining a limited value range based on the first value by the digital signal output unit;

determining a second value corresponding to a new input signal by the digital signal output unit;

judging whether or not the second value is included in the limited value range, and when the second value being judged to be included, outputting the second value to the pulse width modulator as a second digital signal, and when the second value being judged not to be included, outputting a value included in the limited value range to the pulse width modulator as the second digital signal at the second timing at which at least one cycle has elapsed from the first timing by the digital signal output unit; and modulating the pulse width of the second digital signal and generating the pulse width modulation signal, by the pulse width modulator.

2. The pulse width modulation method according to claim 1, wherein the limited value range is included in the prescribed value range.

3. The pulse width modulation method according to claim 2, wherein:

the pulse width modulation signal includes at least one of a section of a first signal and a section of a second signal having an output level different from the first signal, each having a time width based on a value of the digital signal being input; and the limited value is determined so that a signal which is constituted by connecting a pulse width modulation signal being generated based on the second digital signal after a pulse width modulation signal being generated based on the first digital signal includes two sections of two first signals and the section of the second signal which is sandwiched between the two first signals, and the section of the second signal has a time width being greater than or equal to a prescribed time width.

4. The pulse width modulation method according to claim 3, wherein:

in said determining the limited value range, the limited value range is determined based on the first value and an output level of the pulse width modulation signal at a prescribed timing within a cycle including the first timing; and in said generating the pulse width modulation signal, based on the output level of the pulse width modulation signal at the prescribed timing, the pulse width modulation signal corresponding to the second digital signal is generated.

5. The pulse width modulation method according to claim 3, wherein the section of the first signal in each cycle is longitudinally symmetric about a time center of the cycle, and the pulse width modulation signal has the second signal at a boundary between a cycle starting from the first timing and a cycle starting from the second timing.

6. The pulse width modulation method according to claim 3, wherein the section of the first signal in each cycle is longitudinally symmetric about a time point shifted from a time center of the cycle by a given time.

7. The pulse width modulation method according to claim 6, wherein in said generating the pulse width modulation signal, the pulse width modulation signal is generated so that the pulse width modulation signal has the first signal at a boundary between a cycle starting from the first timing and a cycle starting from the second timing.

8. The pulse width modulation method according to claim 4, wherein the prescribed value range and the limited value range are set so that a difference in widths of these both value ranges is less than or equal to a prescribed value.

9. A digital-analogue converter comprising:

a digital signal output unit that receives an input signal on a cycle basis and outputs a digital signal corresponding to the input signal; and a pulse width modulator that is capable of modulating the digital signal, the value of which is included in a prescribed value range in synchronization with the cycle, wherein:

said pulse width modulator modulates the digital signal and generates a pulse width modulation signal;

said digital signal output unit includes a digital signal generator that generates the digital signal corresponding to the input signal and a digital signal limiter that limits and outputs the generated digital signal;

said digital signal limiter limits the digital signal generated by said digital signal generator to a value range which is limited based on a first digital signal outputted to said pulse width modulator by said digital signal output unit at a first timing, outputs the limited digital signal to said pulse width modulator as a second digital signal at a second timing at which at least one cycle has elapsed from the first timing, and sends an error occurred in the limitation as a limit error to said digital signal generator; and said pulse width modulator modulates the inputted second digital signal and generates the pulse width modulation signal.

10. The digital-analogue converter according to claim 9, wherein:

the pulse generator performs pulse width modulation so as to output the pulse width modulation signal including at least one of a section of a first signal and a section of a second signal having an output level different from the first signal, based on a value of the digital signal being input;

said pulse generator generates and outputs a pulse width modulation signal based on the first digital signal and thereafter continuously generates and outputs a pulse width modulation signal based on the second digital signal;

the pulse width modulation signals being continuously outputted include at least two sections of two first signals and the section of the second signal which is sandwiched between the two sections of the two first signals; and said digital signal limiter outputs the second digital signal so that the sandwiched section of the second signal has a time width being greater than or equal to a prescribed time width.

11. The digital-analogue converter according to claim 10, wherein:

said pulse width modulator further includes a flag generator that generates a flag according to the pulse width modulation signal generated by said pulse generator;

said digital signal limiter limits the digital signal generated by said digital signal generator to the limited value range according to a state of the flag at the first timing which is based on the pulse width modulation signal being generated based on the first digital signal, and outputs the digital signal as the second digital signal; and said pulse generator generates the pulse width modulation signal corresponding to the second digital signal based on the state of the flag.

12. The digital-analogue converter according to claim 10, wherein said pulse generator generates the pulse width modulation signal so that the section of the first signal in each cycle is longitudinally symmetric about a time center of the cycle, and the pulse width modulation signal has the second signal at a boundary between a cycle starting from the first timing and a cycle starting from the second timing.

13. The digital-analogue converter according to claim 10, wherein said pulse generator generates the pulse width modulation signal so that the section of the first signal is longitudinally symmetric about a time point shifted from a time center of the cycle by a given time.

14. The digital-analogue converter according to claim 13, wherein said pulse generator is capable of generating the pulse width modulation signal so that the pulse width modulation signal has the first signal at a boundary between a cycle starting from the first timing and a cycle starting from the second timing.

15. The digital-analogue converter according to claim 11, wherein when the pulse width modulation signal being generated and outputted based on the first digital signal includes only the section of the first signal in a cycle starting from the first timing, said digital signal limiter limits the digital signal generated by the digital signal generator to the limited value range so that the pulse width modulation signal generated and outputted based on the second digital signal has the section of the second signal in a cycle starting from the second timing, and outputs the digital signal as the second digital signal;

said pulse generator generates the pulse width modulation signal corresponding to the second digital signal so that the pulse width modulation signal has the section of the second signal at a start of the cycle starting from the second timing; and the pulse width modulation signal being generated and outputted based on the first digital signal and the pulse width modulation signal corresponding to the second digital signal have one or more edges of prescribed number, respectively.

16. The digital-analogue converter according to claim 9, wherein the prescribed value range and the limited value range are set so that a difference in widths of these both value ranges is less than or equal to a prescribed value.

17. The digital-analogue converter according to claim 9, wherein said digital signal generator is a noise shaping type delta-sigma quantizer.

* * * * *